US007052666B2

(12) United States Patent
Colbert et al.

(10) Patent No.: US 7,052,666 B2
(45) Date of Patent: May 30, 2006

(54) METHOD FOR CUTTING SINGLE-WALL CARBON NANOTUBES

(75) Inventors: Daniel T. Colbert, Houston, TX (US); Hongjie Dai, Sunnyvale, CA (US); Jason H. Hafner, Somerville, MA (US); Andrew G. Rinzler, Newberry, FL (US); Richard E. Smalley, Houston, TX (US); Jie Liu, Chapel Hill, NC (US); Kenneth A. Smith, Katy, TX (US); Ting Guo, Davis, CA (US); Pavel Nikolaev, Houston, TX (US); Andreas Thess, Kusterdingen (DE)

(73) Assignee: William Marsh Rice University, Houston, TX (US)

( * ) Notice: Subject to any disclaimer, the term of this patent is extended or adjusted under 35 U.S.C. 154(b) by 530 days.

(21) Appl. No.: 10/027,671

(22) Filed: Dec. 21, 2001

(65) Prior Publication Data

US 2002/0096634 A1 Jul. 25, 2002

Related U.S. Application Data

(62) Division of application No. 10/000,746, filed on Nov. 30, 2001, which is a continuation of application No. 09/242,040, filed as application No. PCT/US97/13896 on Aug. 8, 1997, now abandoned.
(60) Provisional application No. 60/023,732, filed on Aug. 8, 1996.

(51) Int. Cl.
*D01F 9/12* (2006.01)

(52) U.S. Cl. ............... 423/447.1; 423/445 R; 423/461
(58) Field of Classification Search ............. 423/447.1, 423/447.2, 445 R, 445 B, 461
See application file for complete search history.

(56) References Cited

U.S. PATENT DOCUMENTS 5,698,175 A * 12/1997 Hiura et al. ............. 423/447.1
5,985,232 A * 11/1999 Howard et al. .......... 423/447.3

FOREIGN PATENT DOCUMENTS

EP        1 176 234 A2    12/1993

OTHER PUBLICATIONS

Kiang et al. "Structural Modification of Single–Layer Carbon Nanotubes with an Electron Beam", 1996, Journal of Physical Chemistry, vol. 100, No. 9, pp. 3749–3752.*
Seraphin et al. "Single–walled carbon nanotubes produced at high yield by mixed catalysts", Apr. 18, 1994, Applied Physics Letters, vol. 64, No. 16, pp. 2087–2089.*
de Heer et al. "Aligned Carbon Nanotube Films: Production and Optical and Electronic Properties", May 12, 1995, Science, vol. 268, pp. 845–847.*
Li, et al., "Large–Scale Synthesis of Aligned Carbon Nanotubes," *Science*, vol. 274, Dec. 6, 1996, pp. 1701–1703.
Liu, et al., "Fullerene Pipes," *Science*, vol. 280, May 22, 1998, pp. 1253–1256.
Thess, et al., "Crystalline Ropes of Metallic Carbon Nanotubes," *Science*, vol. 273, Jul. 26, 1996, pp. 483–487.
Tohji, et al., "Purifying single–walled nanotubes," *Nature*, vol. 383, Oct. 24, 1996, pp. 679.
Tohji, et al., "Purification Procedure for Single–Walled Nanotubes," *J. Phys. Chem. B.*, vol. 101, No. 11, 1997, pp. 1974–1978.
Ajayan, et al., "Nanometre–size tubes of carbon," *Rep. Prog. Phys.*, vol. 60, 1997, pp. 1025–1062.
Fishbine, "Carbon Nanotube Alignment and Manipulation Using Electrostatic Fields," *Fullerene Science & Technology*, vol. 4(1), 1996, pp. 87–100.
Ajayan, et al., "Aligned Carbon Nanotube Arrays Formed by Cutting a Polymer Resin–Nanotube Composite," *Science*, vol. 265, Aug. 26, 1994, pp. 1212–1214.
Wang, et al., "Properties of Buckytubes and Derivatives," *Carbon*, vol. 33, No. 7, 1995, pp. 949–958.
Sen, et al., "Structures and Images of Novel Derivatives of Carbon Nanotubes, Fullerenes and Related New Carbon Forms," *Fullerene Science and Technology*, vol. 5(3), 1997, pp. 489–502.
Dravid, et al., "Buckytubes and Derivatives: Their Growth and Implications for Buckyball Formation," *Science*, vol. 259, Mar. 12, 1993, pp. 1601–1604.
Smalley, "From dopyballs to nanowires," *Materials Science and Engineering*, vol. B19, 1993, pp. 1–7.

(Continued)

Primary Examiner—Stuart L. Hendrickson
Assistant Examiner—Peter J Lish
(74) Attorney, Agent, or Firm—Ross Spencer Garsson; Robert C. Shaddox; Winstead Sechrest & Minick P.C.

(57) ABSTRACT

This invention relates generally to cutting single-wall carbon nanotubes (SWNT). In one embodiment, the present invention provides for preparations of homogeneous populations of short carbon nanotube molecules by cutting and annealing (reclosing) the nanotube pieces followed by fractionation. The cutting and annealing processes may be carried out on a purified nanotube bucky paper, on felts prior to purification of nanotubes or on any material that contains single-wall nanotubes. In one embodiment, oxidative etching with concentrated nitric acid is employed to cut SWNTs into shorter lengths. The annealed nanotubes may be disbursed in an aqueous detergent solution or an organic solvent for the fractionation. Closed tubes can also be derivatized to facilitate fractionation, for example, by adding solubilizing moieties to the end caps.

22 Claims, 14 Drawing Sheets

OTHER PUBLICATIONS

Chen, "Growth and Properties of Carbon Nanotubes," *Thesis for the degree Master of Science, Rice University*, Houston, Texas, May 1995.

Rinzler, et al., "Field Emission and Growth of Fullerene Nanotubes," *Presented at the Fall*, 1994 MRS Meeting, Nov. 28, 1994, Boston, submitted for MRS proceedings, vol. 359.

Gamaly, et al., "Mechanism of carbon nanotube formation in the arc discharge," *Physical Review B*, vol. 52, No. 3, Jul. 15, 1995–I, pp. 2083–2089.

Ge, et al. "Scanning tunneling microscopy of single–shell nanotubes of carbon," *Appl. Phys. Lett.*, vol. 65(18), Oct. 31, 1994, pp. 2284–2286.

Ajayan, et al., "Opening carbon nanotubes with oxygen and implications for filling", Nature, vol. 362 (Apr. 8, 1993), pp. 522–525.

Canadian Search Report dated Oct. 11, 2002 for Canadian Application No. 2,283,502.

* cited by examiner

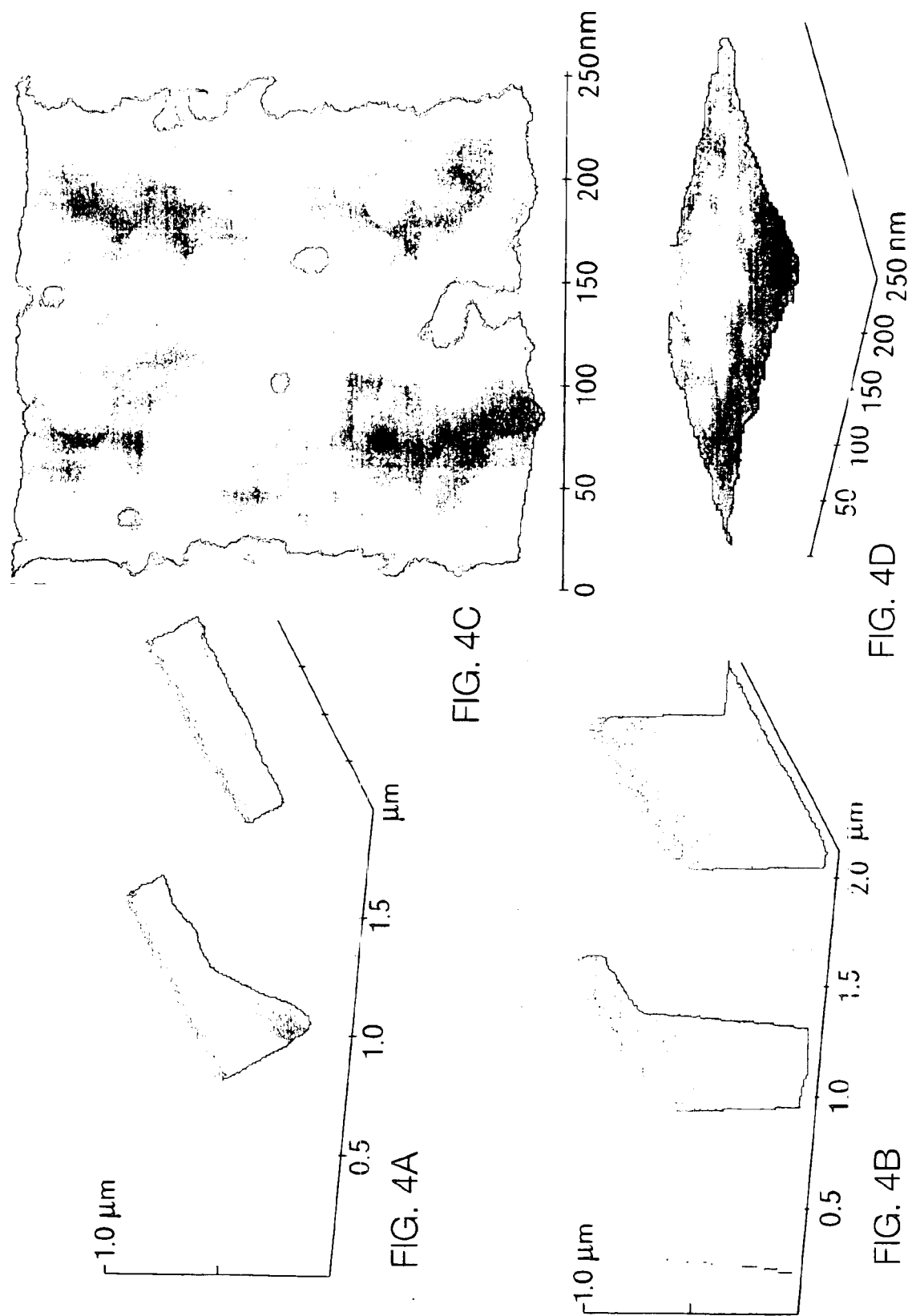

METHOD FOR CUTTING SINGLE-WALL CARBON NANOTUBES

RELATED APPLICATIONS

This application is a division of prior application Ser. No. 10/000,746, filed on Nov. 30, 2001, which is a continuation of prior application Ser. No. 09/242,040 filed on Sep. 13, 1999, now abandoned, which is the 35 U.S.C. § 371 national application of International Application Number PCT/US97/13896 filed on Aug. 8, 1997, which designated the United States, claiming priority to provisional U.S. patent application Ser. No. 60/023,732 filed on Aug. 8, 1996. Each of the foregoing applications is commonly assigned to the assignee of the present invention and is hereby incorporated herein by reference in its entirety.

This application discloses subject matter related to the subject matter of U.S. patent application Ser. No. 09/380,545, filed on Sep. 3, 1999 in the name of Richard E. Smalley et al., entitled "Carbon Fibers Formed From Single-Wall Carbon Nanotubes," which application is commonly assigned to the assignee of the present invention and hereby incorporated herein by reference in its entirety.

TECHNICAL FIELD OF THE INVENTION

This invention relates generally to the field of macroscopically manipulable nanoscale devices that permit information to be provided to or obtained form a nanoscale environment, and more particularly to the use of nanotubes attached to macroscale mounting members as nanoscale probes, fabricators and manipulators.

BACKGROUND OF THE INVENTION

The development of mechanical, electrical, chemical and biological devices and systems that include or comprise nanoscale components, sometimes termed nanotechnology, has been slowed by the unavailability of or limitations inherent in devices that enable sensing, measuring, analyzing, and modifying objects with nanometer resolution and sensing, measuring, analyzing, moving, manipulating, fabricating and modifying objects with nanometer dimensions.

One class of devices that have found some use in nanotechnology applications are proximity probes of various types including those used in scanning tunneling microscopes (STM), atomic force microscopes (AFM and magnetic force microscopes (MFM). While good progress has been made in controlling the position of the macroscopic probe to sub-angstrom accuracy and in designing sensitive detection schemes, the tip designs to date have a number of problems.

One such problem arises from changes in the properties of the tip as atoms move about on the tip, or as the tip acquires an atom or molecule from the object being imaged Another difficulty with existing probe microscope tips is that they typically are pyramidal in shape, and that they are not able to penetrate into small "holes" on the object being imaged, and they may give false image information around sharp vertical discontinuities (e.g., steps) in the object being imaged, because the active portion of the "tip" may shift from the bottom atom to an atom on the tip's side. Moreover, conducting conventional probe microscope tips have never been successfully covered with an insulating material so that the only electrically-active element is the point of the tip itself.

Conventional probe microscope tips also are very rigid in comparison to many of the objects to be examined, and with "soft" samples (e.g., biomolecules like DNA) conventional AFM tips misrepresent the thickness of the object imaged, because that object is literally compressed by the action of the tip.

Thus, there is a need for macroscopically manipulable nanoscale devices for observing, fabricating or otherwise manipulating individual objects in a nanoscale environment that address the foregoing and other disadvantages of the prior art.

SUMMARY OF THE INVENTION

The present invention employs geometrically-regular molecular nanotubes (such as those made of carbon) to fabricate devices that enable interaction between macroscopic systems and individual objects having nanometer dimensions. These devices may comprise one or more individual nanotubes, and/or an assembly of nanotubes affixed to a suitable macroscopically manipulable mounting element whereby the device permits macroscale information to be provided to or obtained from a nanoscale environment.

Individual nanotubes or bundles of nanotubes can be recovered from a material (such as the carbon nanotube "ropes") grown by procedures described herein. Assemblies of nanotubes can be fabricated by physical manipulation of nanotube-containing material, or by self-assembly of groups of nanotubes, or by chemical, physical, or biological behavior of moieties attached to the ends or to the sides of the nanotubes or bundles of nanotubes. Individual nanotubes or assemblies of nanotubes can be grown to achieve specific characteristics by methods described herein.

More particularly, the devices of the present invention can comprise probes with tips comprising one or more molecular nanotubes. When attached to an appropriate motion transducer (piezoelectric, magnetic, etc.) the probe is capable of sensing, measuring, analyzing, and modifying objects with nanometer resolution and sensing, measuring, analyzing, moving, manipulating, and modifying objects with nanometer dimensions.

A method for making such devices is disclosed, which includes the steps of (1) providing a nanotube-containing material; (2) preparing a nanotube assembly comprising at least one nanotube from the nanotube-containing material; and, (3) attaching the nanotube assembly to a macroscopically manipulably mounting element.

The nanoscale devices according to the present invention provide strong, reliably mounted probe tips and other nanoscale fabricators and manipulators, that are gentle, hard to damage, even upon "crashing" into the working surface, that can be easily made electrically conductive, that can present a uniform diameter and precisely known atomic configuration, including precisely located derivitization with chemical moieties.

The devices of the present invention have a number of advantages over conventional microscopy probes (e.g. STM and AFM). A probe tip consisting of a single molecular nanotube or a few such tubes has the advantage that all its constituent atoms are covalently bonded in place and are unlikely to move, even under extreme stress, such as that occurring when the tip "crashes" into the object being imaged. Moreover, the known, stable geometry of molecular nanotube tips allows one to more accurately interpret the data acquired by probe microscopes using such tips. In addition, molecular nanotubes are very compliant, buckling in a gentle, predictable, and controllable fashion under forces that are small enough to avoid substantial deformation to delicate sample objects. Unlike currently used pyramidal probe tips, molecular nanotubes are very long with respect to their diameter, and can therefore reliably image the bottom areas of holes and trenches in the items being imaged.

Electrically conducting nanotube tips can be coated with an insulating material to achieve localized electrical activity at the end of the probe element. This geometry facilitates probing of electrochemical and biological environments.

Molecular nanoprobe elements have remarkably different chemical activity at their ends because the atomic configuration on the ends differs fundamentally from that of the sides. Consequently, one can selectively bond specific molecules to the tip end. This site specific bonding enables chemically-sensitive probe microscopy, and a form of surface modification in which some superficial atoms or molecules of the object being imaged react chemically with the probe tip or species attached or bonded to it. This delicate chemistry enables a form of surface modification that is not possible with conventional tips. This surface modification can serve as a direct manipulation technique for nanometer-scale fabrication, or as a method of lithography in which a "resist" is exposed by the chemical or electrochemical action of the tip.

BRIEF DESCRIPTION OF THE DRAWINGS

For a more complete understanding of the present invention, the objects and advantages thereof, reference is now made to the following descriptions taken in connection with the accompanying drawings in which:

FIG. 3$b$ shows the result of a direct numerical simulation using a buckling force equation.

FIG. 3$c$ shows how the amplitude of an SFM cantilever (driven at a frequency of 253.8 kHz) changes as it engages a surface.

FIGS. 4$a$–$d$ illustrates the probing capabilities of nanotube tips.

DETAILED DESCRIPTION OF THE INVENTION

Figure 1A:
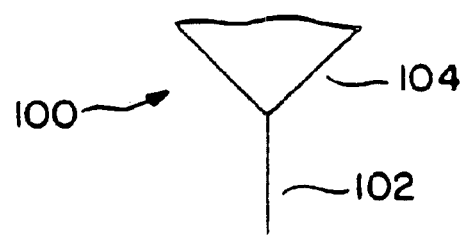
FIGS. 1$a$–$e$ illustrate various embodiments of probe tips according to the present invention.

The preferred embodiment of the present invention and its advantages are best understood by referring to FIGS. 1 through 13 of the drawings, like numerals being used for like and corresponding parts of the various drawings.

Macroscopically Manipulable Nanoscale Devices

Broadly, the macroscopically manipulable nanoscale devices of the present invention comprise a nanotube assembly attached to a mounting element that permits macroscopic manipulation or observation. In a preferred form this device comprises a nanotube probe tip assembly made up of one or more single-wall and/or multi-wail nanotubes. This assembly is connected to a mounting element at one end, with the other end being free and capable of coming into direct contact or near proximity to the object being sensed, measured, analyzed, moved, manipulated, and/or modified. The free "sensing end" has a transverse dimension in the nanometer range. The "sensing end" interacts with objects being sensed, measured, analyzed, moved, manipulated, and/or modified by means which are (either individually or in combination) physical, electrical, chemical, electromagnetic, or biological. These interactions produce forces, electrical currents, or chemical compounds which reveal information about the object and/or modify that object in some way.

Mounting Element

The mounting element facilitates the transduction of information between the macroscopic and nanoscopic worlds. The mounting element supports and moves the probe, and may provide electrical connections to the probe. In addition, the mounting element may serve as a transducer that converts a physical, chemical, electrical, mechanical, or optical response of the probe itself to another form that is more readily detectable by instrumentation known to those skilled in the art of probe microscopy. The mounting element also serves to enable the probe's motion and to facilitate its action in the sensing, measuring, analyzing, moving, manipulating, and modifying other objects.

For many analytical applications, the currently employed mounting systems can be employed in carrying out the present invention. In this regard, the cantilever or probe tip of various known proximity probes such as STM, AFM and MFM devices can serve as the mounting element of the present invention. These devices typically provide for observation of or activation by macroscopically manipulable forces, using sensing methods that typically measure the deflection of the mounting element (e.g., cantilever) by electronic (e.g., tunneling current), optical (e.g., optical interferometry or beam deflection, or electro mechanical (e.g., piezoelectric) elements. For the structure and operation of such conventional mounting elements, reference can be made to the following, all of which are hereby incorporated by reference in their entirety:

---

| Marcus et al. | U.S. Pat. No. 5,475,318 |
| Beha et al. | U.S. Pat. No. 4,918,309 |

| | |
|---|---|
| Jain et al. | U.S. Pat. No. 5,566,987 |
| Burnham et al. | U.S. Pat. No. 5,193,383 |

In the devices described in these references and others of similar function and structure, the present invention contemplates replacing or augmenting the probe tip, or surface interaction element, with a nanotube assembly as described below.

Nanotube Assembly

The nanotube assembly of the present invention can be formed from any geometrically regular molecular nanotubes, and is preferably prepared from isolated, purified carbon nanotubes produced by any of the methods described herein. The carbon nanotube can be multi-wall or single-wall, with single-wall carbon nanotubes being preferred. The single-wall carbon nanotube can be of the metallic type, i.e. arm chair or (n,n) in configuration or of the insulating type, i.e. (m,n) in configuration. For applications requiring electrical conductivity, the most preferred are (10,10) SWNTs. The carbon nanotubes may be substituted, i.e., have lattice atoms other than C (e.g. BN systems) or external derivitized by the addition of one or more chemical moieties at either a side location, an end location, or combinations. The carbon nanotubes may also be endohedrally modified by including one or more internal species inside the tube structure. Suitable endohedral species include metals (e.g. Ni, Co, Yb), ions, small molecules and fullerenes. Endohedral species may have magnetic properties (i.e. ferromagnetic, paramagnetic), electrochemical properties, optical properties, or other suitable properties.

The structure of the nanotube assembly can vary depending on the purpose for which the device is used. In many cases, a single nanotube will serve as the nanotube assembly. Referring to FIG. 1a, such an assembly is shown. Nanotube assembly 100 consists of a mounting element 104 with a single nanotube 102 attached thereto. Small bundles of generally parallel and coterminating nanotubes containing from about 2–100 nanotubes, preferably about 2 to about 20 nanotubes and most preferably about 5 to about 10 nanotubes, can also be employed. (See FIG. 1b). This assembly 120 consists of a bundle of nanotubes 122. This bundle 122 can be held together by van der Waals forces or otherwise bound together.

Figure 1B:
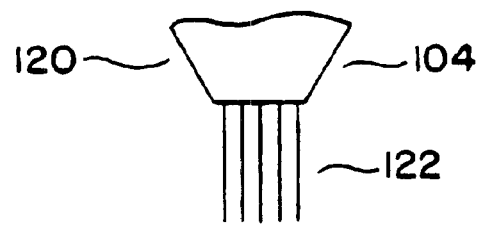
Figure 1C:
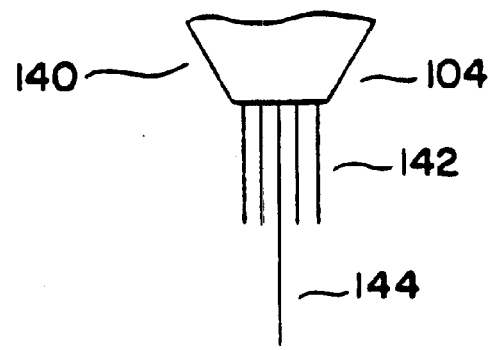
Figure 1D:
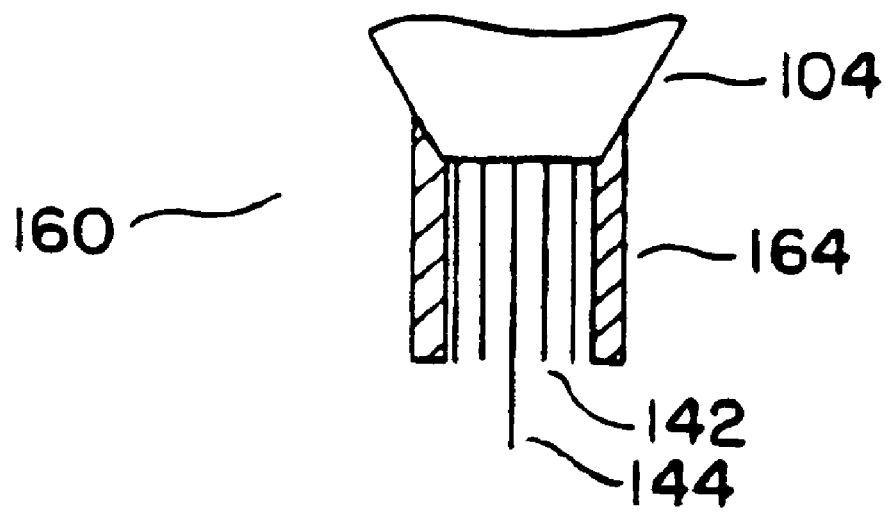

In one preferred embodiment shown in FIG. 1c, a bundle of nanotubes 142 forming the nanotube assembly 140 includes at least one nanotube 144 that extends beyond the end of the other nanotubes in the bundle. This extension can result from employing at least one longer nanotube or bonding an extension length to the end of the bundle (i.e. to one of the bundle length nanotubes). Also, as shown in FIG. 1d and described below, the nanotube assembly 160 may be coated (preferably after attachment to the mounting element) with a suitable material 164.

The diameter of the nanotube assembly can be uniform along its length (as in the embodiment of FIGS. 1(a) and 1(b)) or non uniform along its length (as in the embodiments of FIGS. 1(c) and (d)). Even in the latter forms it is preferred that the tip section of FIGS. 1(c) and (d) respectively is of uniform diameter. Useful diameters can range from a few nm (for single tubes) up to about 100 nm for ropes or bundles. Preferred are bundles having diameters of about 2 nm to about 50 nm, and most preferred are diameters of about 5 nm to about 20 nm.

The total length of the nanotube assembly can be from about 1 to 100 times its diameter, preferably greater than 20 times its diameter. In general, lengths of from about 50 to about 10,000 nm are employed, depending on the nature of the device and its intended environment of operation. For probes (e.g. STM, AFM) the nanotube assembly should be from about 50 nm to 5000 nm in length with about 300 nm to about 500 nm being preferred. For structures of the type shown in FIG. 1(c) the single nanotube tip portion can extend for up to ½ or more of the length of the total assembly. For example, a 550 nm long tip of the type shown in FIG. 1(c) has a body section 142 of about 300 nm and a tip section 144 of about 250 nm.

Method of Attaching a Nanotube Assembly to a Mounting Element

In another embodiment, a method for attaching a nanotube assembly (which can include a single nanotube or a bundle, e.g., a rope of nanotubes) to a mounting element is provided. Fundamental to the mounting process is the surprising realization that the nanotubes, which in two dimensions are substantially smaller than the wavelength of visible light (even when several run alongside each other in a thicker bundle), may nevertheless be adequately perceived with an optical microscope to permit their observation and mounting. This observability under visible illumination is possible because, for the component of light which is polarized along the length of the nanotube (in which direction the nanotubes are longer than the wavelength of visible light), where this component has adequate intensity and the scattering from other objects is minimized to permit contrast, the nanotubes scatter light with sufficient efficiency to be rendered observable.

In the case of through the objective lens illumination utilizing unpolarized white light, the source must be made so intense that even with high quality anti-reflection coated optics, reflections from optical component surfaces and the scattering of light from imperfections in the optical components renders the contrast too poor to permit observation of individual nanotubes or thin bundles. This limitation is largely circumvented by application of the dark field technique; however, even with the advantages that this provides, confirmation that a very thin sample, which appears to the dark adapted eye as the barest visible ghost of an image, requires a sensitive camera capable of integrating the image (operationally, for quick assessment an electronic device such as a CCD camera, rather than film is desirable). Alternatively, a thin laser beam, polarized along the direction of the nanotube, is passed through an off axis portion of the objective lens where the back reflections from optical components are directed out of the field of view and imperfections in the components are avoided (as indicated by minimizing the degree of extraneous field illumination as the beam is moved around to different portions of the objective). Alternatively, light (white or laser) is trained on the sample from a side perpendicular to the axis of the nanotube such that light scattering off the nanotube enters the microscope objective. In all these cases the visibility of the sample is greatly enhanced when the orientation of the nanotube, relative to the propagation direction of the illumination and the optic axis of the microscope are arranged as if a mirror resides in the plane of the nanotube, oriented such as to maximize the specular reflection of the source into the field of view of the microscope.

The first step in the method of this invention is to provide a nanotube-containing material. As discussed below, there are several techniques for preparing these materials. The next step in the process involves preparation of the nanotube assembly. For assemblies made of single nanotubes or bundles of nanotubes this step may comprise separating an individual nanotube or bundle form a material containing these forms. For example, for raw arc grown boule, a small piece of boule material can be ripped from the as grown deposit and attached to its mount using double-sided tape. For oxygen purified material, a small piece may similarly be ripped from the purified boule. Individual nanotubes and bundles which stick out from this piece of boule (outliers) are then available for attachment to the mounting device. Generally it is found that such a sample presents few outliers and they are often too well embedded in the dense piece of boule to permit pulling out. More opportunities are presented if the raw boule material is ground into roughly 10–100 μm chunks which are then picked up by double-sided tape. In another embodiment, the nanotube assembly can comprise carbon fibers grown from SWNT molecular arrays as described below. Carbon fibers grown using the random growth of carbon fibers from SWNTs as described below, also may be used.

The next step in the method of this invention involves attaching to (mounting) the nanotube assembly to the mounting element. The mounting procedure requires at minimum two precision XYZ translation stages, stages A and B. These stages must be arranged such that the sharp point or edge of the mounting element to which the nanotube assembly (single or bundle) is to be mounted is supported by one of the translation stages in the field of view of the microscope (stage A), while a mass of nanotubes from which the nanotube sample is to be culled is similarly supported in the microscope field of view by the second translation stage B. Manual actuators for these stages are adequate for the mounting, however, for some applications, additional final sample preparation steps require the use of electromechanical actuators.

It is found that the number of outliers available for attachment is greatly enhanced if the surface of the piece of boule has a piece of tape gently touched to it such that nanotubes become embedded in the adhesive layer and the tape is then lifted off in a direction perpendicular to the surface, pulling out a layer of nanotubes tens of microns thick. The tug of war between the nanotubes on either side of the boundary layer separating the two newly formed surfaces (one on the remaining piece of boule and the other on the piece of tape) has the effect of orienting the exposed nanotubes perpendicular to each new surface thus generating the numerous outliers. In an alternate embodiment, it may be desirable to mount the piece of tape on stage B and then to cull the nanotube sample from this material.

For mounting the nanotube sample onto the mounting device, a selected outlier is situated in the field of view of the microscope while the appropriate tip or edge of the mounting device is brought up alongside the outlier such that there is appreciable overlap. The mounting device or outlier is then translated in such a manner that contact is made between the two over the length of the overlap. Attachment of the outlier to the mounting device tip with sufficient bond strength to permit the nanotube sample to be detached from the mass of nanotubes affixed on stage B may be effected in several ways.

In a preferred embodiment, the force of attachment is provided by the van der Waals bonding between the nanotube sample and the surface of the mounting device. For this to be sufficiently strong to extact the sample, the surface of the mounting device must have large sections which are smooth and regular on an atomic scale permitting intimate contact between the nanotube sample surface(s) and the device surface. A highly graphitized carbon fiber (commercially available) is an example of such a device, which being electrically conducting additionally provides for electrical connection to the nanotube. The graphitic nature of the surface in this case makes the total bond strength particularly strong since the atomic registration between the graphene surface of nanotubes and the graphitic surface of the fiber permits particularly intimate contact over more atoms per unit area than any other surface.

Once intimate contact between the sample and the mounting device has been made, the mounting device is translated in a direction away from the nanotube layer. Often, when the bond strength of the nanotube sample to the mounting device tip surface exceeds the strength of its bonds to other nanotubes that it contacts on the tape side layer, the nanotube sample is extracted from the layer and now freely attached to the mounting device.

For some applications, it is necessary to have the tip of the nanotube sample extend further from the point of attachment on the mounting device than the typical length of the extracted sample yields. In such cases a longer sample is generated by attaching one nanotube sample and then repeating the above procedures with the tip of this sample treated as the tip of the mounting device. This may be repeated as often as desired. This procedure may also be applied when the nanotube sample consists of a bundle of nanotubes which end close together but a single nanotube tip sample, of longer single nanotube length, is desired. In that case the last outlier attached should be very faint and uniform in the intensity of its light scattered indicating it to be a single nanotube.

In another preferred embodiment, the tip of the mounting device to which the nanotube sample is to be attached is pretreated with a thin adhesive layer before contact to the nanotube sample is made. The adhesive can be one which must cure like an epoxy resin in order to form a bond or one which remains tacky. An example of the latter is provided by the adhesive layer on the double sided tape which is used to affix the nanotube mass to its mount on stage B. This is particularly convenient because the thin adhesive layer can be applied to the tip of the mounting device, in situ, under microscopic observation, just prior to nanotube sample contact. To accomplish this, the mounting device tip is translated to a nanotube free region of the tape, where the tip is then driven a few microns into the adhesive layer and subsequently withdrawn, pulling out with it a thin layer of the adhesive which has coated the tip. Contact with an outlier is now made as above and the nanotube sample similarly extracted. In the case of an adhesive requiring a cure the appropriate conditions (e.g., UV light, heat, hardener etc.) must be provided to effect the cure prior to attempting to extract the sample.

In this implementation, if electrical connection to the nanotube sample is required such connection can be guaranteed (despite the use of insulating adhesives) by applying the adhesive to only the very tip of the mounting device and selecting only the longest outliers to ensure that there is direct contact between the uncoated, electrically conducting portion of the mounting device tip (beyond the adhesive covered portion) and the nanotube sample.

In some applications, the mounted nanotube sample may be subjected to mechanical or environmental stresses which make it desirable to make the attachment to the mounting device more robust. This is accomplished by the application of a coating over the nanotube sample and mounting device tip. While this has been achieved by dipping the assembly in a fluid solution of the coating material, it is found that delivery of the coating material from the vapor phase has several distinct advantages. These include: a) stresses on the sample are minimized during the process ensuring that the sample survives, b) the amount of the coating material applied may be controlled by simple control over the time of deposition and is not subject to more difficult to control viscosity and surface tension parameters encountered in the application of fluid media, and c) for some coating materials (in particular, those which do not undergo a liquid phase upon condensing on the sample) it is possible to obtain a nanometer scale coating thickness which is uniform over the whole of the nanotube sample.

Coatings applied in this way can include cyanoacrylate, methacrylate (modified and pure, both in two part cure formulation and a UV cure formulation), Parylene2 and polyimide. Other types of coatings that may be applied from the vapor phase include silicon from the UV decomposition of silanes in an inert atmosphere as well as silicon dioxide from the decomposition of silanes in an oxygen atmosphere. Finally, metals may be coated on the nanotube samples from vapors of organometallic species (e.g., Fe from $Fe(CO)_3$).

In some applications, the coating has important utility beyond that of securing the nanotube sample onto the mounting device tip. In the case of some biological and electrochemical probing applications, it is necessary that the probe be electrically insulated from its fluid environment at all but its very tip. The polymeric coatings mentioned above each provide a uniform, insulating coating that adds little thickness to the probe diameter, are ideal for this application. The polymer for coatings may include a florescent species for rendering nanotubes more visible, e.g., against the background of a cell. In other applications (e.g., for field emission sources) it is necessary that thermal vibrations of the nanotube sample, fixed as it is at only one end, be minimized. In such cases, the coating thickness may be made as large as necessary to adequately stabilize the tip. In both these instances, it may be necessary to remove the coating from the last few hundred nanometers at the tip of the nanotube sample.

If the holder fixing the mounting element with its mounted nanotube sample on stage A and the holder fixing an opposing sharp tipped electrode on stage B are electrically isolated from the microscope base, and each other, an electrical potential can be applied between the nanotube sample and opposing electrode. A consequence of this is that as stage A is translated so as to bring the nanotube sample tip into the proximity of the electrode tip, the oppositely charged objects attract each other causing the flexible nanotube sample to bend into alignment with the electrode tip. One utility of this involves visibility of the attached sample. It was mentioned above that for thin tipped nanotube samples (single or thin bundle), the visibility of the sample depends strongly on the relative angles between the incident light, the nanotube axis, and the microscope optic axis. Thus, in an attempt to mount a nanotube sample, if the nanotube is not observed at the tip of the mounting device it may in fact be attached there, however, at an angle that does not permit its observation. By allowing the orientation of the nanotube to be modified to an angle allowing it to be observed, this technique provides a quick assay of whether or not a sample has been attached. The opposing electrode can simply be another outlier from the layer of nanotubes from which mounting is being attempted on stage B.

Probes for Analytical Applications

The molecular nanotubes attached to a mounting element, according to the present invention, enable the fabrication of probes for various analytical applications on a nanoscale. The probe and its mounting element essentially provide a transducer for interacting with a nanoscale environment. Conventional probe microscopy techniques are enabled and improved by the use of nanotube probe elements of this invention.

A molecular nanotube probe element is fundamentally different from conventional probe microscopy tips in shape, and mechanical, electronic, chemical and electromagnetic properties. These differences permit new modes of operation of probe microscopes, and new forms of probe microscopy.

Probes according to the present invention include those useful in imaging, at nanoscale resolution or greater, surfaces and other substrates including individual atoms or molecules such as biomolecules. Examples of conventional probe microscopy of this type include scanning tunneling microscopes (STM), atomic force microscopes (AFM), scanning force microscopes (SFM), magnetic force microscopes (MFM), and magnetic resonance force microscopes (MRFM). In this type of probe the conventional tip element can be replaced by the nanotube assembly and existing mounting systems (e.g. the cantilever or a tip on a cantilever) form the mounting element.

Figure 1E:
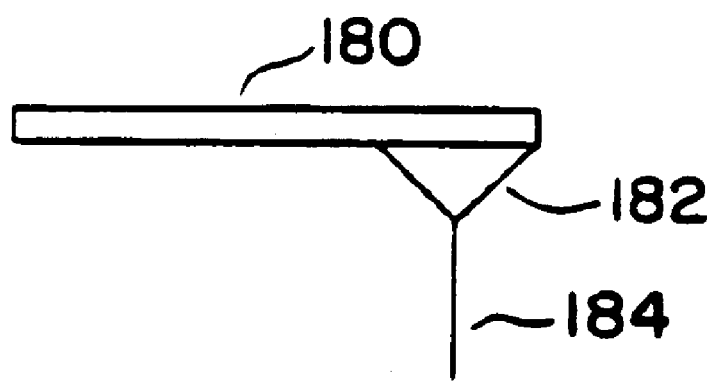

FIG 1e shows a typical STM or AFM probe having a cantilever 180 which has a conventional tip 182 and a nanotube assembly 184 (in this case a single nanotube) extending from the tip. The nanotube assembly 184 may be attached to the tip 182 in the same fashion discussed earlier. The cantilever 180 can be used as a part of a larger device in the known manner. A coating, as described above, may be applied to the probe and the mounting element.

In a preferred embodiment, the mounting devices may be pre-coated with a layer of conductive metal in order to produce a good electrical contact to the nanotube probe.

When used in tapping mode AFM (where the change in amplitude of an oscillating cantilever driven near its resonant frequency is monitored as the tip taps the surface; the sharp frequency response of high-quality cantilevers make this technique exquisitely sensitive. A carbon nanotube tip, such as that shown in FIG. 1(c), has the unusual advantage that it is both stiff below a certain threshold force, but is compliant above that threshold force. The is no bending of the nanotube at all when it encounters a surface at near normal incidence until the Euler buckling force, $F_{EULER}$ is exceeded, which is given by the equation:

$$F_{EULER} = n\pi^2 YI/L^2 \qquad (1)$$

where n is a parameter determined by the tip mounting, Y is the Young's modulus, I is the moment of inertia of the tip cross section and L is the free length of the tip extending beyond the mounting assembly. The Euler buckling force for tips of the preferred embodiment described above is in the one nano-Newton range. Once the Euler bucking force is exceeded, the nanotube will bend easily through large amplitudes with little additional force. Euler buckling therefore serves as a kind of insurance policy during SFM imaging: the maximum force that can be transmitted to the sample is $F_{EULER}$. In addition, the nanotube tip is extremely gentle when touching an object laterally. The bending motion for side-directed forces is harmonic with a force constant, $k_n = 3YI/L^3$. For the nanotube tip of FIG. 1(c), $k_n = 6.3$ pN/mn.

The mechanism for reduction in the tapping amplitude in operation is almost entirely elastic. The spring force from the bending nanotube produces a de-excitation of the cantilever oscillation at driving frequencies below the critical frequency, ω*. The result is that gentle, reliable AFM imaging may be accomplished in the tapping mode with even extremely stiff high-resonant frequency cantilevers. In contrast to the hard silicon pyramidal tip which can easily generate impact forces >100 nN per tap which may substantially modify the geometry of "soft" samples such as large bio-molecules. The nanotube probe serves as a compliant spring which moderates the impact of each tap on the surface, the peak force never exceeding $F_{EULER}$.

Figure 2A:
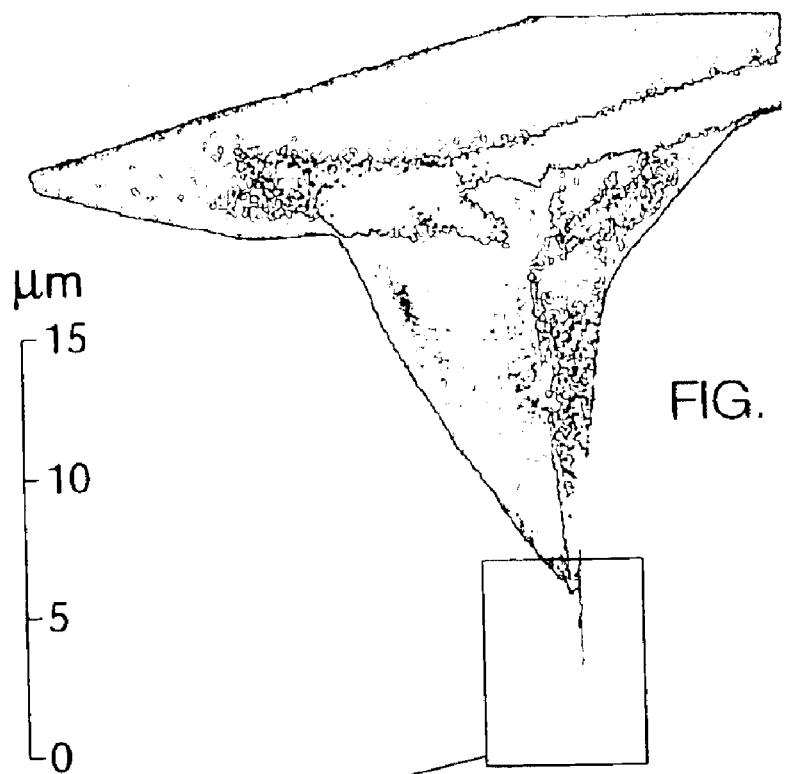
FIGS. 2$a$–$c$ show a typical nanotube probe according to one embodiment of the invention.
Figure 2B:
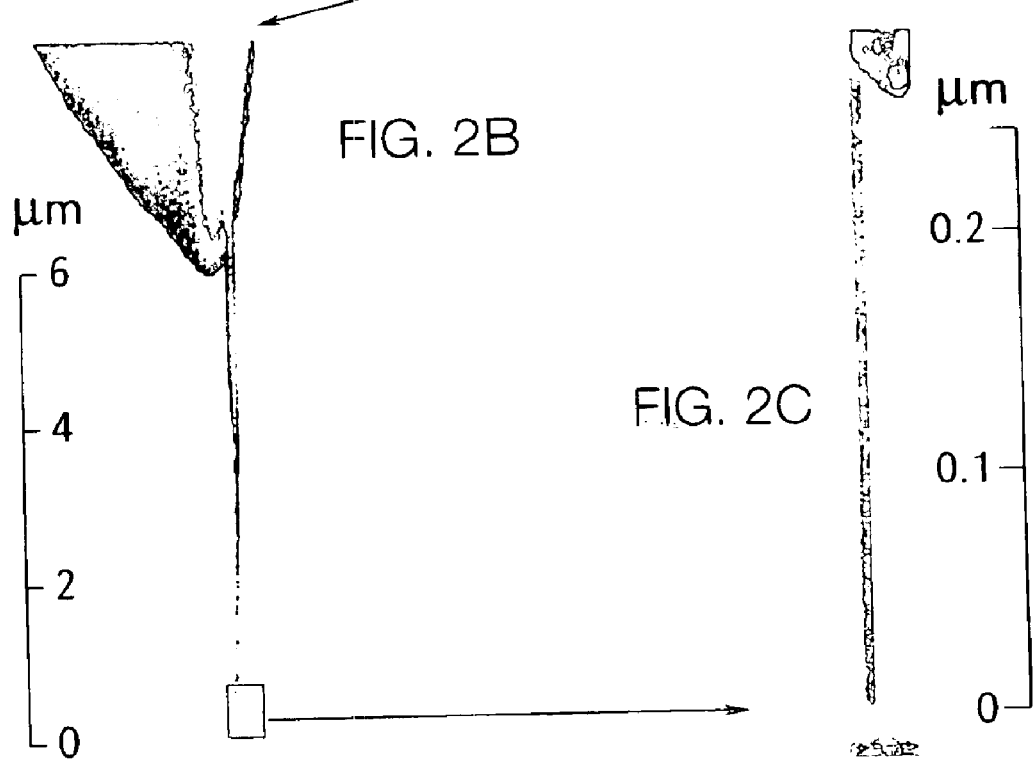
Figure 2C:
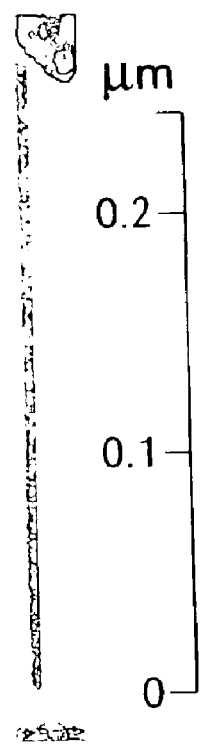

An example of a typical nanotube probe according to one embodiment of the invention is shown in FIGS. 2a–c. A single nanotube was attached to the pyramidal tip of a silicon cantilever for scanning force microscopy. The majority of the 5.5 micron length extending beyond the pyramidal silicon tip was a bundle of 5–10 parallel nanotubes, arranged in van der Waals contact along their length. As evident in the TEM image of FIG. 2c, this bundle narrows down to just a single nanotube 5 nm in diameter, extending alone for the final 250 nm.

Figure 3A:
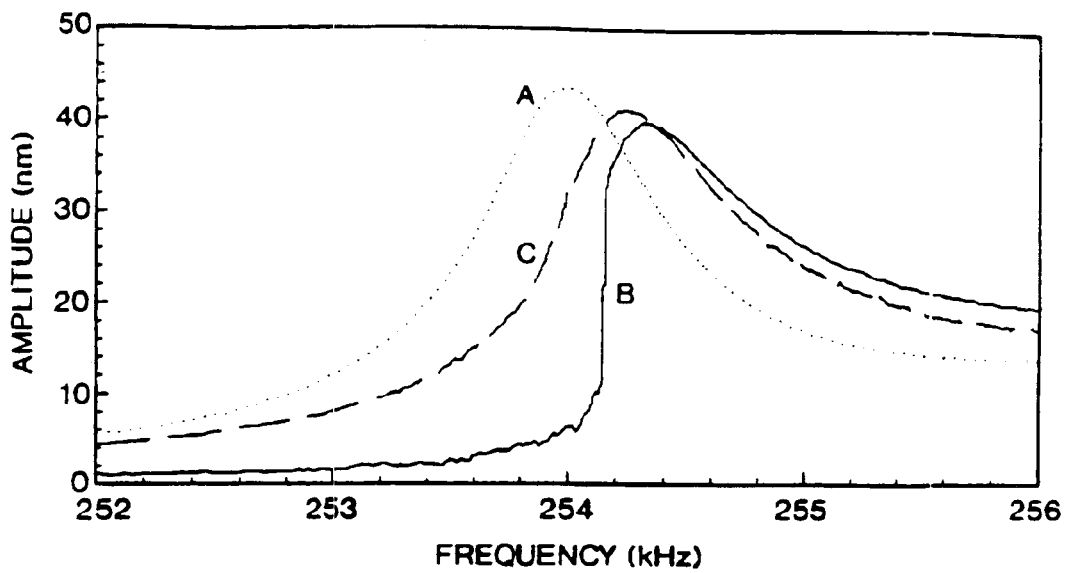
FIG. 3$a$ shows the frequency dependency of the amplitude of a SFM with a nanotube tip engaged in tapping mode.
Figure 3B:
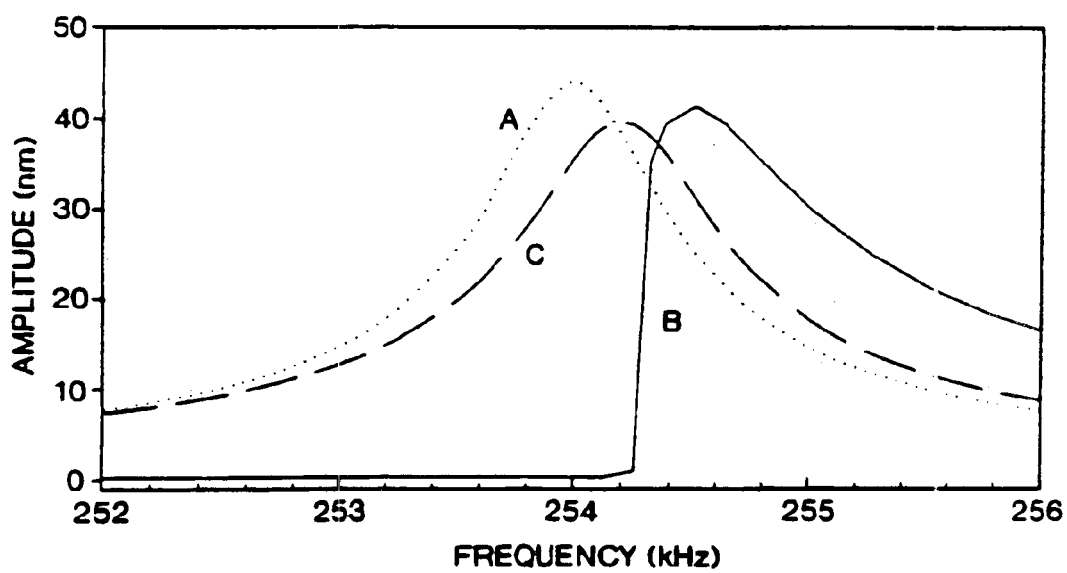
Figure 3C:
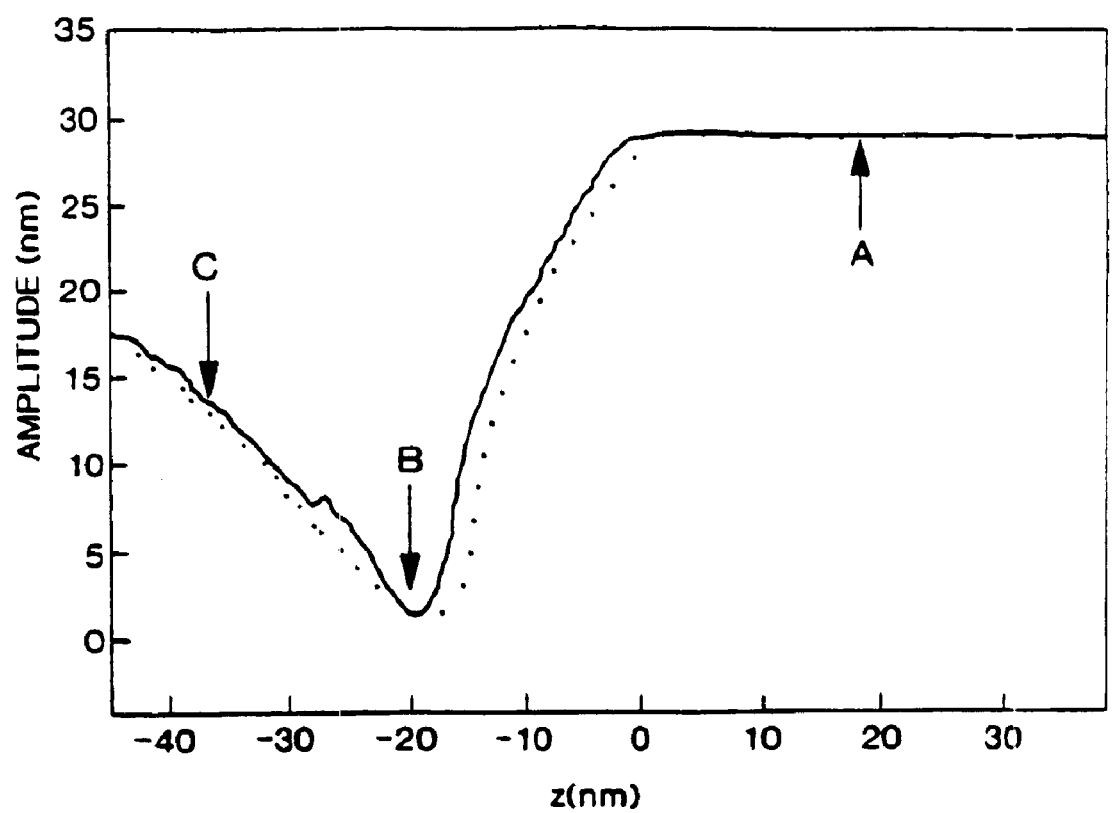

The nanotube tip shown in FIGS. 2a–c was operated in tapping mode SFM. FIG. 3a shows the frequency dependence of the amplitude of the cantilever as it engaged a freshly cleaved surface of mica in air. As seen in FIG. 3c, the tapping amplitude when the cantilever was driven near its resonant frequency (253.8 kHz) dropped rapidly as soon as the nanotube tip came in contact with the mica surface. The amplitude dropped to near zero when the nanotube hit the surface at the midpoint of its oscillation, and then recovered to nearly the full in-air amplitude when the surface was so close that the tip was always in contact, with the nanotube flexing throughout the oscillation. FIG. 3b shows the result of a direct numerical simulation of this experiment using the bucking force expression of equation (1). The sharpness of the recovery of oscillation amplitude near the critical frequency, ω 254.2 kHz is a sensitive function of the buckling force.

Referring to FIGS. 4a–d, which show that long, narrow nanotube tips can reach into deep trenches previously inaccessible to high resolution scanning probes. As is evident in FIG. 4a, the normal pyramidal tip is simply too wide to reach the bottom of a 0.4 m wide 0.8 m deep trench, while the nanotube permits the roughness of the silicon surface at the bottom to be imaged easily. Also as shown in FIG. 4d, it is possible using a voltage pulse on the nanotube to deposit a 40 nm dot of carbon at the bottom of the trench, and then to go back and image the dot. Due to the "spring loading" of the nanotube bundle to the cantilever and the high strength and flexibility of the carbon nanotubes, SFM imaging of tortuous structures such as the trenches shown in FIGS. 4a–d can be done without fear of damage either to the nanotube tip or the trench structure itself.

One of the principal limits in SFM imaging in air has been that at normal humidity the surface is covered with layer of water, and the capillary adhesion forces produced when the tip makes contact are typically 10–100 nN. As a result one is forced to use high force constant cantilevers oscillating with substantial amplitude to insure that the tip does not get caught by the surface. Due to the small diameter of the nanotube, the capillary adhesion force of nanotube tips is generally reduced to <5 nN and often as low as 0.05 nN, permitting tapping mode imaging with cantilevers having force constants as small as 0.01 N/m at a peak-to-peak amplitude of 10 nm.

Figure 5A:
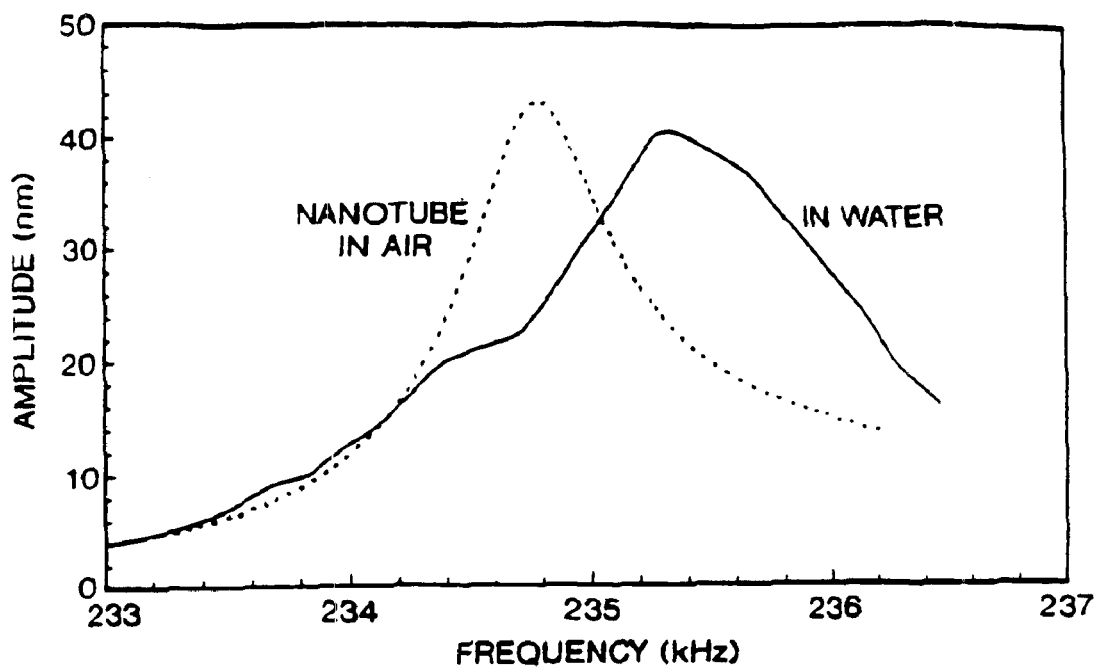
FIGS. 5$a$–$c$ show the frequency dependency of a cantilever having a nanotube probe immersed in water.
Figure 5B:
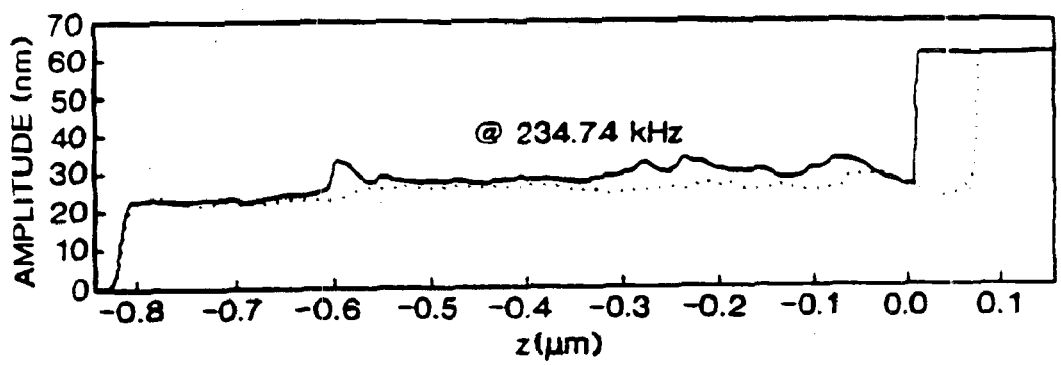
Figure 5C:
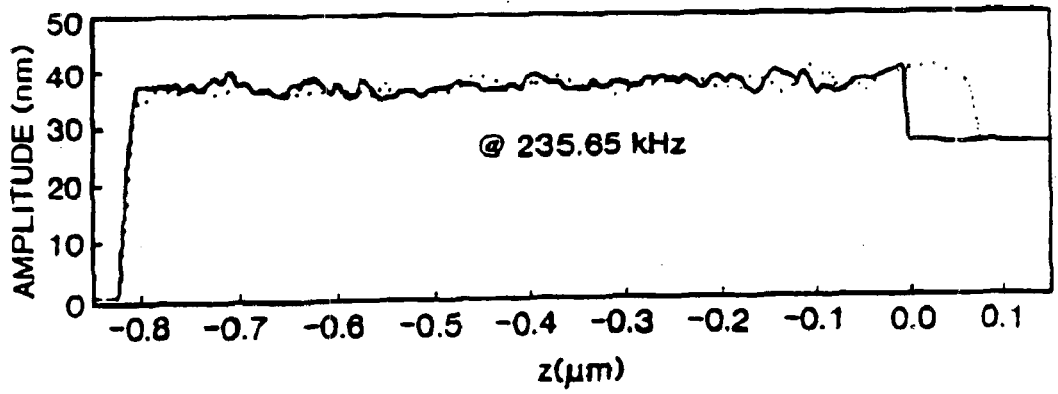

In order to get away entirely from the capillary adhesion force it is now conventional to place the entire AFM transducer assembly under some fluid—normally water. However, now that the cantilever must oscillate in water it is no longer possible to operate at high frequency and high Q. A nanotube tip similar to that of FIG. 2a, was immersed under the surface of water, thus leaving the cantilever free to oscillate in air. FIG. 5a shows that the frequency dependence of the cantilever oscillation is only slightly affected when the lower 0.7 micrometer length of the nanotube is immersed in water within the trench. Also shown is the amplitude of the cantilever oscillation as a function of distance from the meniscus at the top of the trench. FIGS. 5b and c show the amplitude change upon dipping a nanotube probe into the flooded trench. The first contact with the water surface occurred at z=0. The nanotube tip encountered the bottom of the trench at z=−820 nm. The trace in FIG. 5b was done at the resonant frequency of the cantilever oscillating in air (234.74 kHz), and the trace in FIG. 5c was done at 235.65 kHz, where the oscillation amplitude is seen to substantially increase when the tip of the nanotube extends under the water surface.

Figure 6:
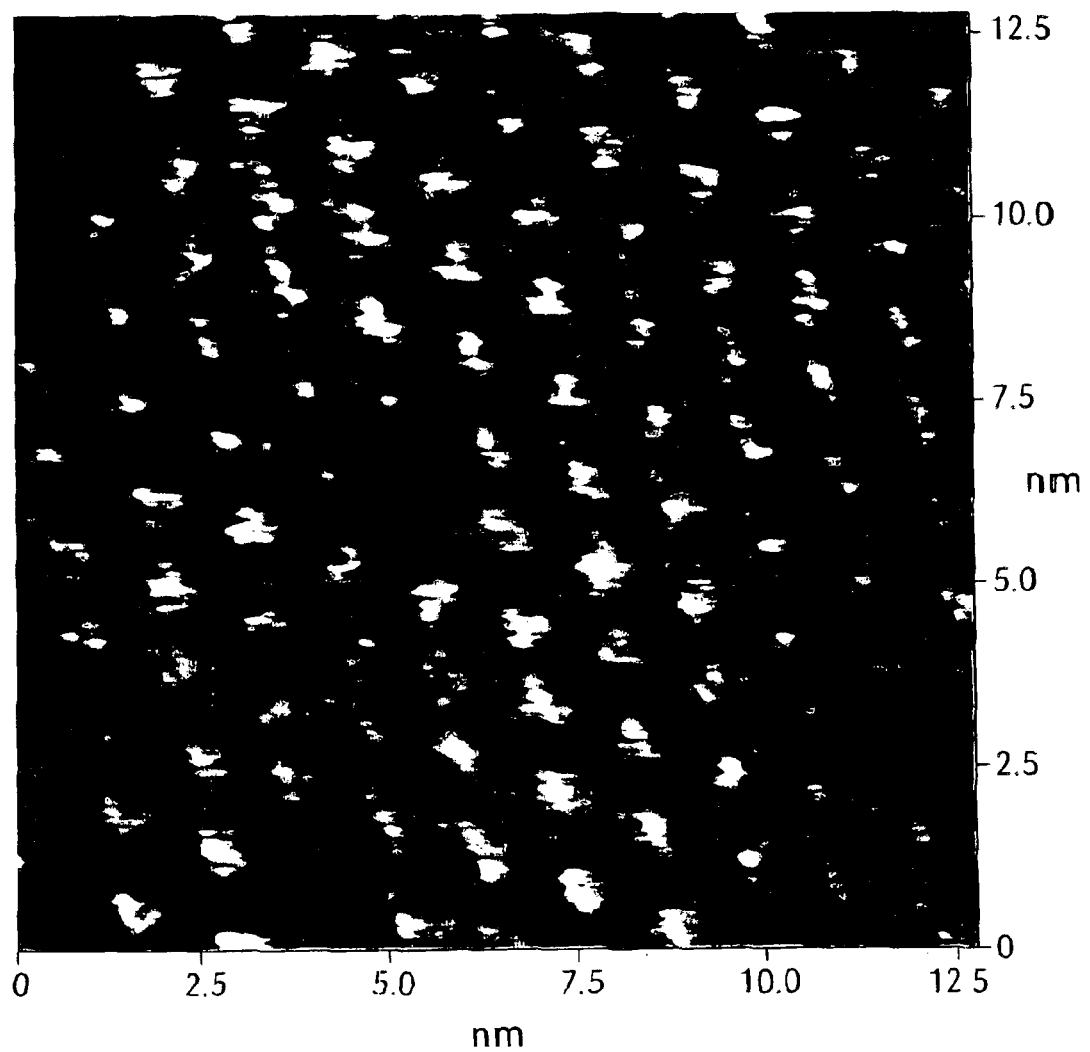
FIG. 6 shows an example of atomic-scale resolution STM using a carbon nanotube to image the charge density waves on a freshly cleaved 1T-TaS2 surface.
Figure 7A:
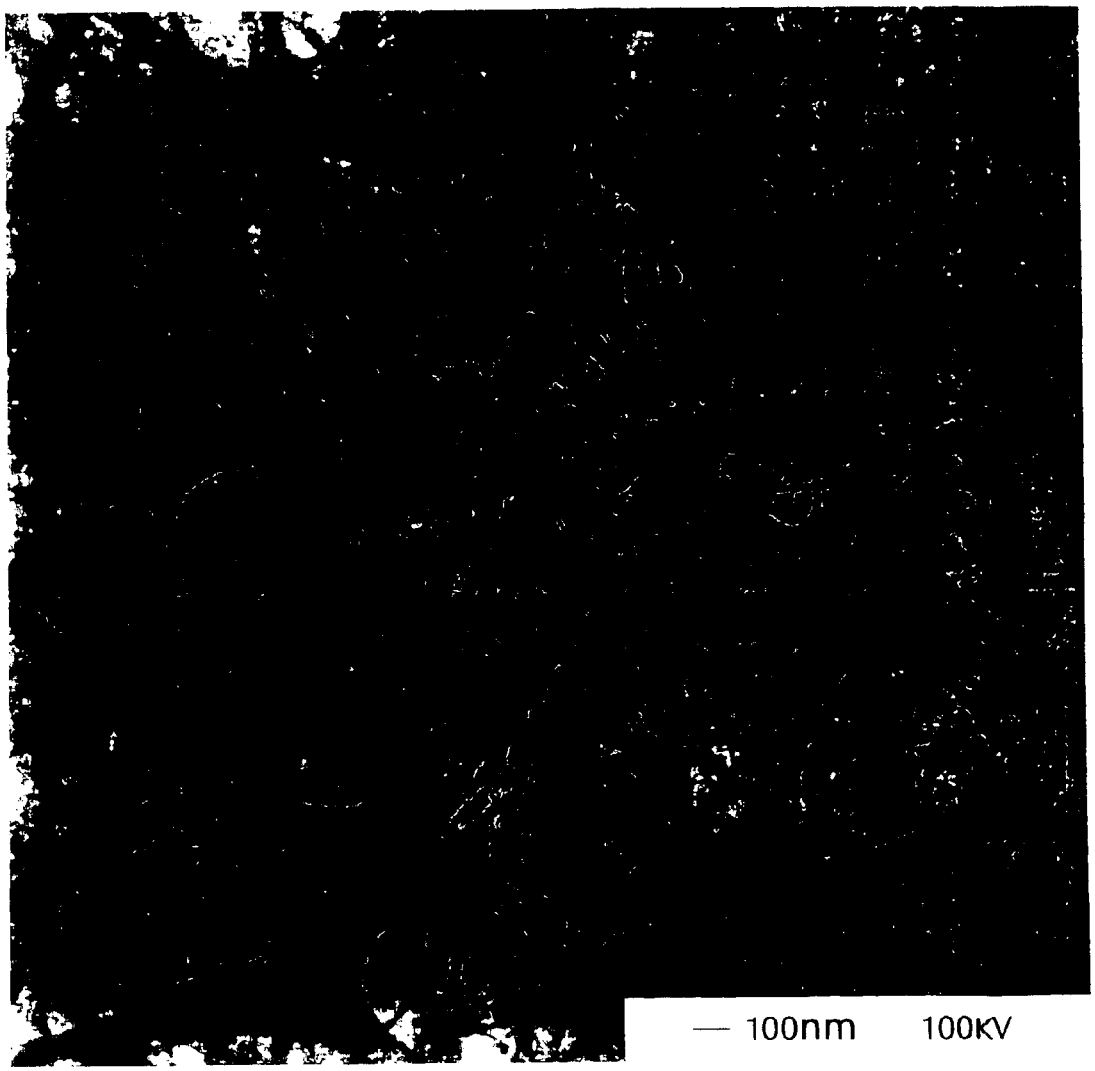
FIG. 7A is a TEM/SEM/Raman spec of purified SWNTs useful in the practice of the present invention.
Figure 7B:
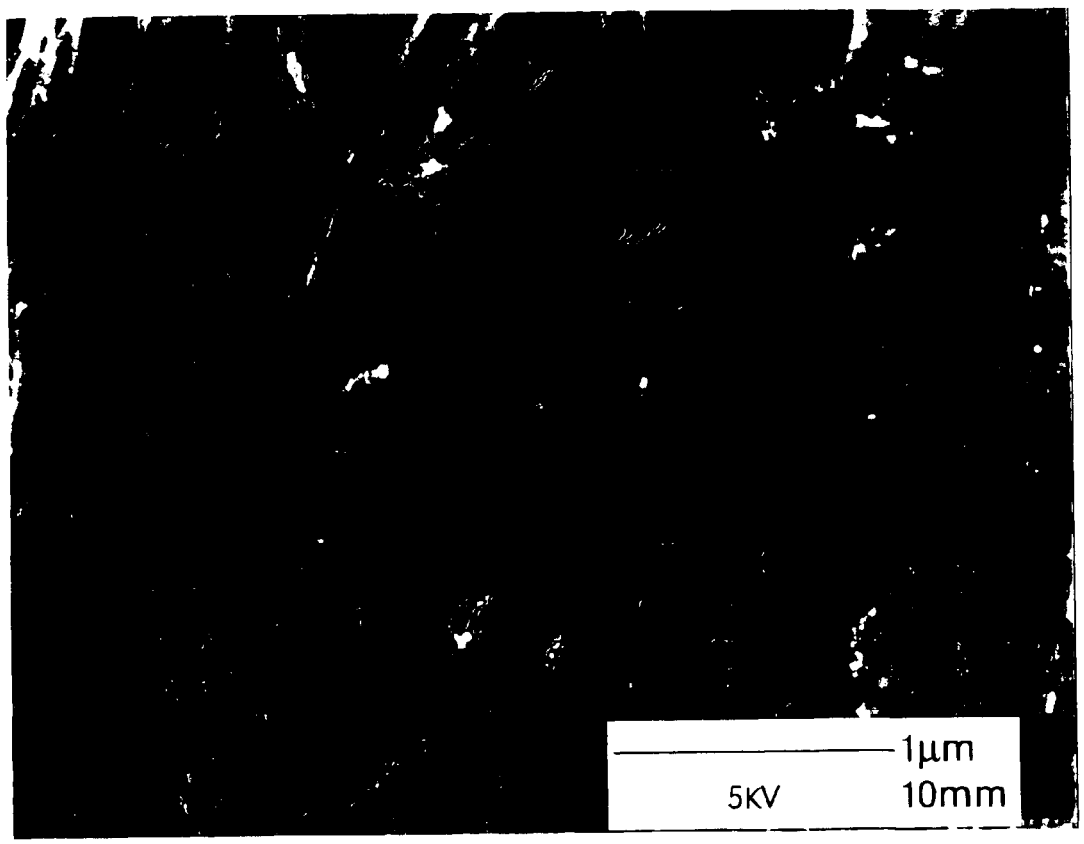
FIG. 7B is a TEM/SEM/Raman spec of purified SWNTs useful in the practice of the present invention.
Figure 7C:
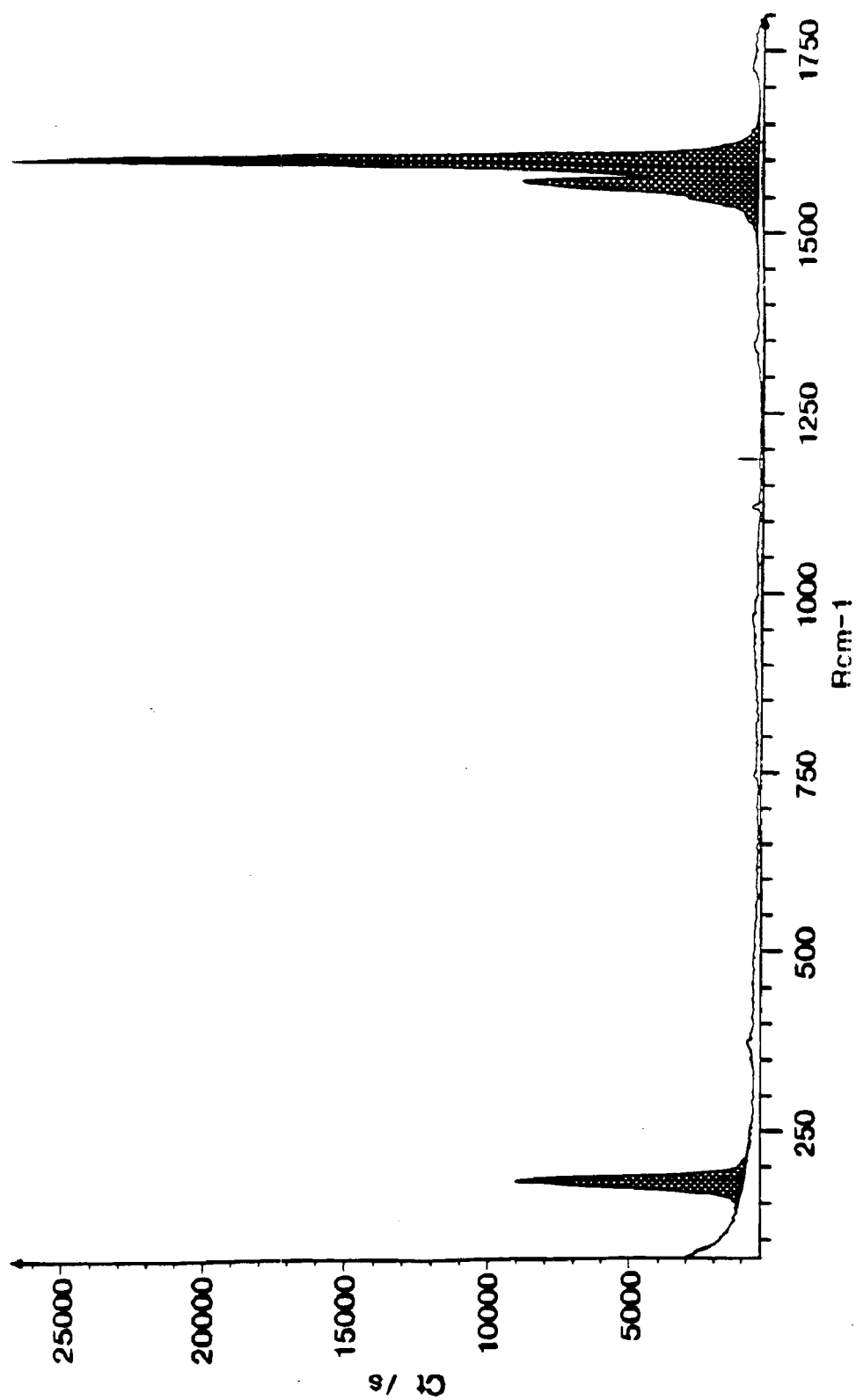
FIG. 7C is a TEM/SEM/Raman spec of purified SWNTs useful in the practice of the present invention.
Figure 8:
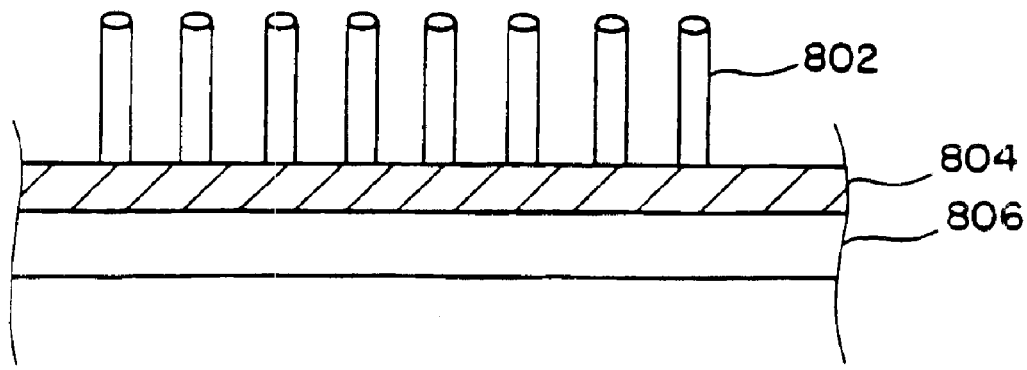
FIG. 8 is a schematic representation of a portion of an homogeneous SWNT molecular array useful in the practice of the present invention.

Since the nanotubes can be electrically conductive, they may be used as probes for scanning tunneling microscopy, STM, and in various scanning electrochemical modes as well. FIG. 6 shows an example of atomic-scale resolution STM using a carbon nanotube to image the charge density waves on a freshly cleaved $1T$-$TaS_2$ surface.

The nanotube probe assemblies of this invention also enable the elicitation of other information from and/or about nanoscale objects or at nanoscale resolution such as conventional friction force microscopy (FFM) which measures the atomic scale friction of a surface by observing the transverse deflection of a cantilever mounted probe tip. The compliance of a nanotube probe of the present invention above the Euler threshold as described above, provides for a totally new method of elastic force microscopy (EFM). By calibration of the Euler buckling force for an individual probe tip, and making appropriate AFM measurements with that tip, one can obtain direct information about the elastic properties of the object being imaged.

Probe tips may also be used to perform nanoscale surface topography measurement. The vertical and horizontal motions of the probe assembly can be calibrated by measurement of surfaces having known geometries (e.g., pyrolytic graphite with surface steps). A thusly-calibrated probe assembly can provide precise measure of the topography of surfaces and fabricated elements such as vias and trenches on integrated-circuit elements in silicon, gallium arsenide, and other electronic substrates.

A number of other new probe microscopy techniques for obtaining information at nanoscale resolution or about/from nanoscale objects is enabled by the present invention. For example, mechanical resonance microscopy (MRM) can be facilitated by mechanical resonances in the nanotube probe element itself. These resonances may be utilized as a means of transduction of information about the object being sensed or modified. Such resonances, as will be known by one skilled in the art, can be sensed by optical, piezoelectric, magnetic and/or electronic means. Interaction of a mechanically resonant probe tip with other objects may be facilitated by derivitization of the probe tip or inclusion of an endohedral species (e.g., one which is optically- or magnetically-active) at or near the probe tip. Mechanically resonant tips can be employed to deliver or receive electronic or optical signals between electronic or optical circuits.

Another novel method for transducing information about an object being sensed or modified is based on the property of the nanotube probe assemblies of this invention to act as sensitive "antenna" for electromagnetic radiation (particularly at optical frequencies). The probe's response to electromagnetic radiation may be sensed by scattering of that radiation by the probe itself, detection and measurement of radio frequency (RF) or microwave frequency (MW) currents passing through the probe as it and the object being sensed interact together in a nonlinear way with electromagnetic radiation of two or more frequencies. Moreover, via its interaction with electromagnetic fields of specified frequencies, the probe may excite electronic, atomic, molecular or condensed-matter states in the object being examined, and the transduction of information about that object may occur by observation of the manifestations of these states.

In another embodiment, the devices of the present invention can facilitate the storing of information in nanoscale objects and the retrieval of the stored information from those objects by virtue of the electronic, mechanical, physical an/or optical response of the molecular nanotube probe elements in interaction with said objects.

Of particular inter is the use of molecular nanotube probe devices according to the present invention in biological systems. In one such application, DNA sequencing can be performed, for example, by AFM imaging of DNA molecules with a nanotube probe element that, due to its physical and chemical properties, permits the recognition of individual bases in the molecule. In another biological application, the probes may also be used as nanelectrodes for electrochemical studies of living cells. In another embodiment, an ion-selective nanotube may be fabricated from a open nanotube filled with water and covered with a selective membrane (e.g., ion-exchange resin, or even a biological membrane). This nanoelectrode can monitor specific cytoplasmic ions with a spatial resolution far superior to those presently available. In a preferred embodiment, a calcium-specific nanoelectrode may be used to provide high spatial and temporal resolution in the measurement of changes in the cytosolic calcium concentrations, often the response to stimuli, in various types of cells.

Derivatized probes can serve as sensors or sensor arrays that effect selective binding to substrates. Devices such as these can be employed for rapid molecular-level screening assays for pharmaceuticals and other bioactive materials.

Probes as Nanoactuators

The molecular nanotube probe elements of the present invention can also be employed to effect manipulation or modification of objects on a nanoscale to facilitate the fabrication of nanotechnology devices or elements. In general, these techniques employ some form of tip/sample interaction to effect this manipulation or modification. This interaction can be direct physical interaction (e.g., to push, pull or drag atoms, molecules, or small objects to a specified location). Indirect interaction can be supplied through forces such as repulsion or attraction (atomic force or magnetic force). Emission from the nanotube tip (e.g. electrons, photons, magnetic forces and the like) may also effect the interaction by electromechanical or chemical means, as described more fully below.

Probe-like assemblies of molecular nanotubes can be used with or without derivatives as tools to effect material handling and fabrication of nanoscale devices. Examples of nanostructure fabrication are given in U.S. Pat. No. 5,126,574 to Gallagher and in U.S. Pat. No. 5,521,390 to Sato et al., both incorporated by reference in their entireties.

The nanoscale device of the present invention also may be used for nanolithography. A nanotube may be mounted on the tip of a device, such as a STM. In operation, the STM tip then produces a highly-localized beam of electrons which may be used to expose an electron-sensitive resist or to directly modify the surface upon which it impinges. Such surface modification or exposure of a resist is useful in fabrication of electronic and other devices having dimensions in the nanometer range, which are smaller than those now available.

Addition of selected chemical species to the end of the nanotube probe tip permits the probe tip to participate in specific chemical or electrochemical processes. The tip can then act as an agent for chemical modification of a surface or object on a nanometer scale. The pattern of this chemical modification is controlled by the collective action of the probe tip and its mounting mechanism.

The ability to precisely and reproducibly covalently bond a chemical moiety at the tip of the preferred carbon nanotube probe structure facilitates another form of chemical interaction with a surface that results in a powerful nanofabrication technique. The (10,10) armchair carbon nanotube has, at its tip, a single pentagon with reactive sites for addition chemistry in its radiating double bonds. By dipping a probe (or array of probes) into a reactive medium, preferably a solution, it is possible to add a chemical moiety that acts as a catalyst to the nanotube tip. This moiety can be a catalyst per se (e.g., an enzyme) or a linking moiety (e.g., a co-enzyme) that has an affinity for a second moiety that is the catalytic moiety, which can be added in a second step. The preferred system only creates a chemical reaction product when the catalyst containing probe tip, the substrate surface, and a reagent(s) flowing over the substrate come into contact. An element formed by the catalyzed reaction product can be positioned discreetly or continuously by intermittent or continuous contact of the probe tip with the surface of a substrate. A complex nanostructure can be built up by performing the above-described probe/surface reaction step sequentially with different probe catalyst/reagent systems to deposit different pattern elements of the device being nanofabricated. Confirmation that the reaction product elements have in fact been formed on the surface can be accomplished by employing a phosphorescent marker that is formed upon completion of the reaction. This system can produce a composite structure with extremely fine lines as well as elements of differing shape and composition. The reaction products forming the pattern(s) or device structure can be biomolecules, which facilitate the fabrication of nanoscale biostructures that may mimic the function of natural biosystems.

Nanotube probes or probe arrays with attached therapeutic moieties can also be used in cell-based therapies to inject these therapeutic moieties directly into cells where they are needed. Release of bound moieties can be effected, for example, by a voltage pulse or other bond destabilizing signal. The nanotube probes of the present invention can also be employed to deliver genetic material (i.e., DNA) attached to the probe tip to cells by similar injection techniques (e.g., during embryonic development).

A nanotube mounted on a STM tip may also be used in desorption induced by electronic transitions, or DIET. Field emitted electrons from the STM tip may be used to bring about hydrogen desorption, giving rise to uses such as nanolithography and material modification on the nanometer and even on the atomic scale.

A STM-tip attached nanotube may also be used in chemically-assisted field evaporation/desorption (CAFE). The accuracy of the nanotube provides the ability to access a particular location on a surface, break strong chemical bonds, transfer one atom or cluster of atoms to the nanotube, and possibly redeposit the atom(s) at another location. Other interactions are also possible.

The nanotubes may also be used with scanned probe microscopy (SPM) to fabricate nanodevices. By attaching a nanotube to a tip of a SPM, a highly localized enhanced oxidation of a substrate can be achieved, and this may be used as an etch mark to create freestanding silicon nanowires. By further processing the nanowire, other confined structures may also be produced.

Manipulators, or "nanotools," may be embodied by devices of the present invention. It is possible to create "nanoforcepts" which, through motion of one or more nanotube probe tips, can grip and move an object of nanometer dimensions. Specific chemical derivitization of the probe end in this application can enhance, modify, or make chemically specific the gripping action of the tip. Through electrical or electrochemical action, the tip can etch an object, moving atoms or molecules in controlled patterns on a nanometer scale. Through catalytic cation of an individual tip or catalytic action of chemical groups attached to the tip, one can achieve chemical modification of an object which can be carried out in a pattern which serves to fabricate patterns or other nanometer scale objects. Direct fabrication of individual structures on an atom-by-atom or molecule-by-molecule basis is possible using the nanoprobes disclosed in this invention. These nanotools may be used to manipulate other nanoobjects, and may also be used to fabricate MEMS (Micro Electro Mechanical Systems).

The following sections provide more detail on the preparation of carbon nanotubes for use in the devices of the present invention.

Carbon Nanotubes

Fullerenes are molecules composed entirely of $sp^2$-hybridized carbons, arranged in hexagons and pentagons. Fullerenes (e.g., $C_{60}$) were first identified as closed spheroidal cages produced by condensation from vaporized carbon.

Fullerene tubes are produced in carbon deposits on the cathode in carbon arc methods of producing spheroidal fuluerenes from vaporized carbon. Fullerene tubes may be closed at one or both ends with end caps or open at one or both ends. Ebbesen et al. (Ebbesen I), "Large-Scale Synthesis Of Carbon Nanotubes," *Nature,* Vol. 358, p. 220 (Jul. 16, 1992) and Ebbesen et al., (Ebbesen II), "Carbon Nanotubes," *Annual Review of Materials Science,* Vol. 24, p. 235 (1994). Such tubes are to herein as carbon nanotubes. Many of the carbon nanotubes made by these processes were multi-wall nanotubes, i.e., the carbon nanotube resembled concentric cylinders. Carbon nanotubes having up to seven walls have been described in the prior art. Ebbesen II; Iijima et al., "Helical Microtubles Of Graphitic Carbon," *Nature,* Vol. 354, p. 56 (Nov. 7, 1991).

Single-wall carbon nanotubes have been made in a DC arc discharge apparatus of the type used in fullerene production by simultaneously evaporating carbon and a small percentage of Group VII transition metal from the anode of the arc discharge apparatus. See Iijima et al., "Single-Shell Carbon Nanotubes of 1 nm Diameter," *Nature,* Vol. 363, p. 603 (1993); Bethune et al., "Cobalt Catalyzed Growth of Carbon Nanotubes with Single Atomic Layer Walls," *Nature,* Vol. 63, p. 605 (1993); Ajayan et al., "Growth Morphologies During Cobalt Catalyzed Single-Shell Carbon Nanotube Synthesis," *Chem. Phys. Lett.,* Vol. 215, p. 509 (1993); Zhou et al., "Single-Walled Carbon Nanotubes Growing Radially From $YC_2$ Particles," *Appl. Phys. Lett.,* Vol. 65, p. 1593 (1994); Seraphin et al., "Single-Walled Tubes and Encapsulation of Nanocrystals Into Carbon Clusters," *Electrochem. Soc.,* Vol. 142, p. 290 (1995); Saito et al., "Carbon Nanocapsules Encaging Metals and Carbides," *J. Phys. Chem. Solids,* Vol. 54, p. 1849 (1993); Saito et al., "Extrusion of Single-Wall Carbon Nanotubes Via Formation of Small Particles Condensed Near an Evaporation Source," *Chem. Phys. Lett,* Vol. 236, p. 419 (1995). It is also known that the use of mixtures of such transition metals can significantly enhance the yield of single-wall carbon nanotubes in the arc discharge apparatus. See Lambert et al., "Improving Conditions Toward Isolating Single-Shell Carbon Nanotubes," *Chem. Phys. Lett.,* Vol. 226, p. 364 (1994).

An improved method of producing single-wall nanotubes is described in U.S. Ser. No. 08/687,665, entitled "Ropes of Single-Walled Carbon Nanotubes" incorporated herein by reference in its entirety. This method uses, inter alia, laser vaporization of a graphite substrate doped with transition metal atoms, preferably nickel, cobalt, or a mixture thereof, to produce single-wall carbon nanotubes in yields of at least 50% of the condensed carbon. The single-wall nanotubes produced by this method tend to be formed in clusters, termed "ropes," of 10 to 1000 single-wall carbon nanotubes in parallel alignment, held together by van der Waals forces in a triangular lattice.

The single wall tubular fullerenes are distinguished from each other by double index (n,m) where n and m are integers that describe how to cut a single strip of hexagonal "chicken-wire" graphite so that it makes the tube perfectly when it is wrapped onto the surface of a cylinder and the edges are sealed together. When the two indices are the same, m=n the resultant tube is said to be of the "arm-chair" (or n,n) type, since when the tube is cut perpendicular to the tube axis, only the sides of the hexagons are exposed and their pattern around the periphery of the tube edge resembles the arm and seat of an arm chair repeated n times. Arm-chair tubes are a preferred form of single-wall carbon nanotubes since they are metallic, and have extremely high electrical and thermal conductivity. In addition, all single-wall nanotubes have extremely high tensile strength.

Purification of Single-Wall Nanotubes

The product of a typical process for making mixtures containing single-wall carbon nanotubes is a tangled felt which can include deposits of amorphous carbon, graphite, metal compounds (e.g., oxides), spherical fullerenes, catalyst particles (often coated with carbon or fullerenes) and possibly multi-wall carbon nanotubes. The single-wall carbon nanotubes may be aggregated in "ropes" or bundles of essentially parallel nanotubes.

When material having a high proportion of single-wall nanotubes is purified as described herein, the preparation produced will be enriched in single-wall nanotubes, so that the single-wall nanotubes are substantially free of other material. In particular, single-wall nanotubes will make up at least 80% of the preparation, preferably at least 90%, more preferably at least 95% and most preferably over 99% of the material in the purified preparation.

One preferred purification process comprises heating the SWNT-containing felt under oxidizing conditions to remove the amorphous carbon deposits and other contaminating materials. In a preferred mode of this purification procedure the felt is heated in an aqueous solution of an inorganic oxidant, such as nitric acid, a mixture of hydrogen peroxide and sulfuric acid, or potassium permanganate. Preferably, SWNT-containing felts are refluxed in an aqueous solution of an oxidizing acid at a concentration high enough to etch away amorphous carbon deposits within a practical time frame, but not so high that the single-wall carbon nanotube material will be etched to a significant degree. Nitric acid at concentrations from 2.0 to 2.6 M have been found to be suitable. At atmospheric pressure, the reflux temperature of such an aqueous acid solution is about 101–102° C.

In a preferred process, the nanotube-containing felts can be refluxed in a nitric acid solution at a concentration of 2.6 M for 24 hours. Purified nanotubes may be recovered from the oxidizing acid by filtration through, e.g., a 5 micron pore size TEFLON filter, like Millipore Type LS. Preferably, a second 24 hour period of refluxing in a fresh nitric solution of the same concentration is employed followed by filtration as described above.

Refluxing under acidic oxidizing conditions may result in the esterification of some of the nanotubes, or nanotube contaminants. The contaminating ester material may be removed by saponification, for example, by using a saturated sodium hydroxide solution in ethanol at room temperature for 12 hours. Other conditions suitable for saponification of any ester linked polymers produced in the oxidizing acid treatment will be readily apparent to those skilled in the art. Typically the nanotube preparation will be neutralized after the saponification step. Refluxing the nanotubes in 6M aqueous hydrochloric acid for 12 hours has been found to be suitable for neutralization, although other suitable conditions will be apparent to the skilled artisan.

After oxidation, and optionally saponification and neutralization, the purified nanotubes may be collected by settling or filtration preferably in the form of a thin mat of purified fibers made of ropes or bundles of SWNTs, referred to hereinafter as "bucky paper". In a typical example, filtration of the purified and neutralized nanotubes on a TEFLON membrane with 5 micron pore size produced a black mat of purified nanotubes about 100 microns thick The nanotubes in the bucky paper may be of varying lengths and may consists of individual nanotubes, or bundles or ropes of up to $10^3$ single-wall nanotubes, or mixtures of individual single-wall nanotubes and ropes of various thicknesses. Alternatively, bucky paper may be made up of nanotubes which are homogeneous in length or diameter and/or molecular structure due to fractionation as described hereinafter.

The purified nanotubes or bucky paper are finally dried, for example, by baking at 850° C. in a hydrogen gas atmosphere, to produce dry, purified nanotube preparations.

When laser-produced single-wall nanotube material, produced by the two-laser method of U.S. Ser. No. 08/687,665, was subjected refluxing in 2.6 M aqueous nitric acid, with one solvent exchange, followed by sonication in saturated NaOH in ethanol at room temperature for 12 hours, then neutralization by refluxing in 6M aqueous HCl for 12 hours, removal from the aqueous medium and baking in a hydrogen gas atmosphere at 850 C. in 1 atm $H_2$ gas (flowing at 1–10 sccm through a 1" quartz tube) for 2 hours, detailed TEM, SEM and Raman spectral examination showed it to be >99% pure, with the dominant impurity being a few carbon-encapsulated Ni/Co particles. (See FIGS. 7A, 7B, and 7C).

In another embodiment, a slightly basic solution (e.g., pH of approximately 8–12) may also be used in the saponification step. The initial cleaning in 2.6 M $HNO_3$ converts amorphous carbon in the raw material to various sizes of linked polycyclic compounds, such as fulvic and humic acids, as well as larger polycyclic aromatics with various functional groups around the periphery, especially the carboxylic acid groups. The base solution ionizes most of the polycyclic compounds, making them more soluble in aqueous solution. In a preferred process, the nanotube containing felts are refluxed in 2–5 M $HNO_3$ for 6–15 hours at approximately 110°–125° C. Purified nanotubes may be filtered and washed with 10 mM NaOH solution on a 3 micron pore size TSTP Isopore filter. Next, the filtered nanotubes polished by stirring them for 30 minutes at 60° C. in a S/N (Sulfuric acid/Nitric acid) solution. In a preferred embodiment, this is a 3:1 by volume mixture of concentrated sulfuric acid and nitric acid. This step removes essentially all the remaining material from the tubes that is produced during the nitric acid treatment.

Once the polishing is complete, a four-fold dilution in water is made, and the nanotubes are again fileted on the 3 micron pore size TSTP Isopore filter. The nanotube are again washed with a 10 mM NaOH solution. Finally, the nanotubes are stored in water, because drying the nanotubes makes it difficult to resuspend them.

Cutting Single-Wall Carbon Nanotubes

Single-wall carbon nanotubes produced by prior methods are so long and tangled that it is very difficult to purify them, or to manipulate them. They can be cut into short enough lengths that they are no longer tangled and the open ends annealed closed. The short, closed tubular carbon molecules may be purified and sorted very readily using techniques that are similar to those used to sort DNA or size polymers.

Preparation of homogeneous populations of short carbon nanotubes molecules may be accomplished by cutting and annealing (reclosing) the nanotube pieces followed by fractionation. The cutting and annealing processes may be carried out on a purified nanotube bucky paper, on felts prior to purification of nanotubes or on any material that contains single-wall nanotubes. When the cutting and annealing process is performed on felts, it is preferably followed by oxidative purification, and optionally saponification, to remove amorphous carbon. Preferably, the starting material for the cutting process is purified single-wall nanotubes, substantially free of other material.

The short nanotube pieces can be cut to a length or selected from a range of lengths, that facilitates their intended use. The length can be from just greater than the diameter of the tube up to about 1,000 times the diameter of the tube. Typical tubular molecules will be in the range of from about 5 to 1,000 nanometers or longer. For making template arrays useful in growing carbon fibers of SWNT as described below, lengths of from about 50 to 500 nm are preferred.

Any method of cutting that achieves the desired length of nanotube molecules without substantially affecting the structure of the remaining pieces can be employed. The preferred cutting method employs irradiation with high mass ions. In this method, a sample is subjected to a fast ion beam, e.g., from a cyclotron, at energies of from about 0.1 to 10 giga-electron volts. Suitable high mass ions include those over about 150 AMU's such as bismuth, gold, uranium and the like.

Preferably, populations of individual single-wall nanotube molecules having homogeneous length are prepared starting with a heterogeneous bucky paper and cutting the nanotubes in the paper using a gold ($Au^{+33}$) fast ion beam. In a typical procedure, the bucky paper (about 100 micron thick) is exposed to $^-10^{12}$ fast ions per $cm^2$, which produces severely damaged nanotubes in the paper, on average every 100 nanometers along the length of the nanotubes. The fast ions create damage to the bucky paper in a manner analogous to shooting 10–100 nm diameter "bullet holes" through the sample. The damaged nanotubes then can be annealed (closed) by heat sealing of the tubes at the point where ion damage occurred, thus producing a multiplicity of shorter nanotube molecules. At these flux levels, the shorter tubular molecules produced will have a random distribution of cut sizes with a length peak near about 100 nm. Suitable annealing conditions are well know in the fullerene art, such as for example, baking the tubes in vacuum or inert gas at 1200° C. for 1 hour.

The SWNTs may also be cut into shorter tubular molecules by intentionally incorporating defect-producing atoms into the structure of the SWNT during production. These defects can be exploited chemically (e.g., oxidatively attacked) to cut the SWNT into smaller pieces. For example, incorporation of 1 boron atom for every 1000 carbon atoms in the original carbon vapor source can produce SWNTs with built-in weak spots for chemical attack.

Cutting may also be achieved by sonicating a suspension of SWNTs in a suitable medium such as liquid or molten hydrocarbons. One such preferred liquid is 1,2-dichloreothane. Any apparatus that produces suitable acoustic energy can be employed. One such apparatus is the Compact Cleaner (One Pint) manufactured by Cole-Parmer, Inc. This model operates at 40 KHZ and has an output of 20 W. The sonication cutting process should be continued at a sufficient energy input and for a sufficient time to substantially reduce the lengths of tubes, ropes or cables present in the original suspension. Typically times of from about 10 minutes to about 24 hours can be employed depending on the nature of the starting material and degree of length reduction sought.

In another embodiment, sonification may be used to create defects along the rope lengths, either by the high temperatures and pressures created in bubble collapse (~5000° C. and ~1000 atm), or by the attack of free radicals produced by sonochemistry. These defects are attacked by S/N to cleanly cut the nanotube, exposing the tubes underneath for more damage and cutting. In a preferred process, the nanotubes are bath sonocated while being stirred in 40–45° C. S/N for 24 hours. Next, the nanotubes are stirred with no sonification in the S/N for 2 hours at 40–45° C. This is to attack, with the S/N, all the defects created by the sonification without creating more defects. Then, the nanotubes are diluted four-fold with water, and then filtered using a 0.1 micron pore size VCTP filter. Next, the nanotubes are filtered and washed with a 10 mM NaOH solution on the VCTP filter. The nanotubes are polished by stirring them for 30 minutes at 70° C. in a S/N solution. The polished nanotubes are diluted four-fold with water, filtered using the 0.1 micron pore size VCTP filters, then filtered and washed with 10 mM NaOH on a 0.1 micron pore size VCTP filter, and then stored in water.

Oxidative etching (e.g., with highly concentrated nitric acid) can also be employed to effect cutting of SWNTs into shorter lengths. For example, refluxing SWNT material in concentrated $HNO_3$ for periods of several hours to 1 or 2 days will result in significantly shorter SWNTs. The rate of cutting by this mechanism is dependent on the degree of helicity of the tubes. This fact may be utilized to facilitate separation of tubes by type, i.e., (n,n) from (m,n).

In another embodiment, SWNTs can be cut using electron beam cutting apparatus in the known manner. Nanotubes may also be cut by the use of a plasma arc. Combination of the foregoing cutting techniques can also be employed.

Homogeneous populations of single-wailed nanotubes may be prepared by fractioning heterogeneous nanotube populations after annealing. The annealed nanotubes may be disbursed in an aqueous detergent solution or an organic solvent for the fractionation. Preferably the tubes will be disbursed by sonication in benzene, toluene, xylene or molten naphthalene. The primary function of this procedure is to separate nanotubes that are held together in the form of ropes or mats by van der Waals forces. Following separation into individual nanotubes, the nanotubes may be fractionated by size by using fractionation procedures which are well known, such as procedures for fractionating DNA or polymer fractionation procedures. Fractionation also can be performed on tubes before annealing, particularly if the open ends have substituents (carboxy, hydroxy, etc.), that facilitate the fractionation either by size or by type. Alternatively, the closed tubes can be opened and derivatized to provide such substituents. Closed tubes can also be derivatized to facilitate fractionation, for example, by adding solubilizing moieties to the end caps.

Electrophoresis is one such technique well suited to fractionation of SWNT molecules since they can easily be negatively charged. It is also possible to take advantage of the different polarization and electrical properties of SWNTs having different structure types (e.g., arm chair and zig-zag) to separate the nanotubes by type. Separation by type can also be facilitated by derivatizing the mixture of molecules with a moiety that preferentially bonds to one type of structure.

In a typical example, a 100 micron thick mat of black bucky paper, made of nanotubes purified by refluxing in nitric acid for 48 hours was exposed for 100 minutes to a 2 GeV beam of gold ($Au^{+33}$) ions in the Texas A&M Superconducting Cyclotron Facility (net flux of up to $10^{12}$ ions per $cm^2$). The irradiated paper was baked in a vacuum at 1200° C. for 1 hr to seal off the tubes at the "bullet holes", and then dispersed in toluene while sonicating. The resultant tubular molecules were examined via SEM, AFM and TEM.

The procedures described herein produce tubular molecules that are single-wall nanotubes in which the cylindrical portion is formed from a substantially defect-free sheet of graphene (carbon in the form of attached hexagons) rolled up and joined at the two edges parallel to its long axis. The nanotube can have a fullerene cap (e.g., hemispheric) at one end of the cylinder and a similar fullerene cap at the other end. One or both ends can also be open. Prepared as described herein, these SWNT molecules are substantially free of amorphous carbon. These purified nanotubes are effectively a whole new class of tubular molecules.

In general the length, diameter and helicity of these molecules can be controlled to any desired value. Preferred lengths are up to $10^6$ hexagons; preferred diameters are about 5 to 50 hexagon circumference; and the preferred helical angle is 0° to 30°.

Preferably, the tubular molecules are produced by cutting and annealing nanotubes of predominately arm-chair (n,n) configuration, which may be obtained by purifying material produced according to the methods of U.S. Ser. No. 08/687,665. These (n,n) carbon molecules, purified as described herein, are the first truly "metallic molecules." The metallic carbon molecules are useful as probes for scanning probe microscopy such as are used in scanning tunneling microscopes (STM) and atomic force microscopes (AFM).

Derivitization of Carbon Nanotubes

The tubular carbon molecules (including the multiwall forms) produced as described above can be chemically derivatized at their ends (which may be made either open or closed with a hemi-fullerene dome). Derivatization at the fullerene cap structures is facilitated by the well-known reactivity of these structures. See, "The Chemistry of Fullerenes" R. Taylor ed., Vol. 4 of the advanced Series in Fullerenes, World Scientific Publishers, Singapore, 1995; A. Hirsch, "The Chemistry of the Fullerenes," Thieme, 1994.

Alternatively, the fullerene caps of the single-walled nanotubes may be removed at one or both ends of the tubes by short exposure to oxidizing conditions (e.g., with nitric acid or $O_2/CO_2$) sufficient to open the tubes but not etch them back too far, and the resulting open tube ends maybe derivatized using known reaction schemes for the reactive sites at the graphene sheet edge.

In general, the structure of such molecules can be shown as follows:

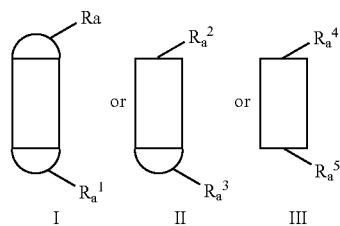

where

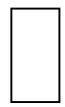 is a substantially defect-free cylindrical graphene sheet (which optionally can be doped with non-carbon atoms) having from about $10^2$ to about $10^6$ carbon atoms, and having a length of from about 5 to about 1000 nm, preferably about 5 to about 500 nm;

 is a fullerene cap that fits perfectly on the cylindrical graphene sheet; has at least six pentagons and the remainder hexagons and typically has at least about 30 carbon atoms;

n is a number from 0 to 30, preferably 0 to 12; and
$R, R^1, R^2, R^3, R^4$, and $R^5$ each may be independently selected from the group consisting of hydrogen; alkyl, acyl, aryl, aralkyl, halogen; substituted or unsubstituted thiol; unsubstituted or substituted amino; hydroxy, and OR' wherein R' is selected from the group consisting of hydrogen, alkyl, acyl, aryl aralkyl, unsubstituted or substituted amino; substituted or unsubstituted thiol; and halogen; and a linear or cyclic carbon chain optionally interrupted with one or more heteroatom, and optionally substituted with one or more $=O$, or $=S$, hydroxy, an aminoalkyl group, an amino acid, or a peptide of 2–8 amino acids.

The following definitions are used herein.

The term "alkyl" as employed herein includes both straight and branched chain radicals, for example methyl, ethyl, propyl, isopropyl, butyl, t-butyl, isobutyl, pentyl, hexyl, isohexyl, heptyl, 4,4-dimethylpentyl, octyl, 2,2,4-trimethylpentyl, nonyl, decyl, undecyl, dodecyl, the various branched chain isomers thereof. The chain may be linear or cyclic, saturated or unsaturated, containing, for example, double and triple bonds. The alkyl chain may be interrupted or substituted with, for example, one or more halogen, oxygen, hydroxy, silyl, amino, or other acceptable substituents.

The term "acyl" as used herein refers to carbonyl groups of the formula —COR wherein R may be any suitable substituent such as, for example, alkyl, aryl, aralkyl, halogen; substituted or unsubstituted thiol; unsubstituted or substituted amino, unsubstituted or substituted oxygen, hydroxy, or hydrogen.

The term "aryl" as employed herein refers to monocyclic, bicyclic or tricyclic aromatic groups containing from 6 to 14 carbons in the ring portion, such as phenyl, naphthyl, substituted phenyl, or substituted naphthyl, wherein the substituent on either the phenyl or naphthyl may be for example $C_{1-4}$ alkyl, halogen, $C_{1-4}$ alkoxy, hydroxy or nitro.

The term "aralkyl" as used herein refers to alkyl groups as discussed above having an aryl substituent, such as benzyl, p-nitrobenzyl, phenylethyl, diphenylmethyl and triphenylmethyl.

The term "aromatic or non-aromatic ring" as used herein includes 5–8 membered aromatic and non-aromatic rings uninterrupted or interrupted with one or more heteroatom, for example O, S, SO, $SO_2$, and N, or the ring may be unsubstituted or substituted with, for example, halogen, alkyl, acyl, hydroxy, aryl, and amino, said heteroatom and substituent may also be substituted with, for example, alkyl, acyl, aryl, or aralkyl.

The term "linear or cyclic" when used herein includes, for example, a linear chain which may optionally be interrupted by an aromatic or non-aromatic ring. Cyclic chain includes, for example, an aromatic or non-aromatic ring which may be connected to, for example, a carbon chain which either precedes or follows the ring.

The term "substituted amino" as used herein refers to an amino which may be substituted with one or more substituent, for example, alkyl, acyl, aryl, aralkyl, hydroxy, and hydrogen.

The term "substituted thiol" as used herein refers to a thiol which may be substituted with one or more substituent, for example, alkyl, acyl, aryl, aralkyl, hydroxy, and hydrogen.

Typically, open ends may contain up to about 20 substituents and closed ends may contain up to about 30 substituents. It is preferred, due to stearic hindrance, to employ up to about 12 substituents per end.

In addition to the above described external derivatization, the SWNT molecules of the present invention can be modified endohedrally, i.e., by including one or more metal atoms inside the structure, as is known in the endohedral fullerene art. It is also possible to "load" the SWNT molecule with one or more smaller molecules that do not bond to the structures, e.g., $C_{60}$, to permit molecular switching as the $C_{60}$ bucky ball shuttles back and forth inside the SWNT molecule under the influence of external fields or forces.

To produce endohedral tubular carbon molecules, the internal species (e.g., metal atom, bucky ball molecules) can either be introduced during the SWNT formation process or added after preparation of the tubular molecules. Incorporation of metals into the carbon source that is evaporated to form the SWNT material is accomplished in the manner described in the prior art for making endohedral metallofullerenes. Bucky balls, i.e., spheroidal fullerene molecules, are preferably loaded into the tubular carbon molecules of this invention by removing one or both end caps of the tubes employing oxidation etching described above, and adding an excess of bucky ball molecules (e.g., $C_{60}$, $C_{70}$) by heating the mixture (e.g., from about 500 to about 600° C.) in the presence of $C_{60}$ or $C_{70}$ containing vapor for an equilibration period (e.g., from about 12 to about 36 hours). A significant proportion (e.g., from a few tenths of a percent up to about 50 percent or more) of the tubes will capture a bucky ball molecule during this treatment. By selecting the relative geometry of the tube and ball this process can be facilitated. For example, $C_{60}$ and $C_{70}$ fit very nicely in a tubular carbon molecule cut from a (10,10) SWNT (I.D.=1 nm). After the loading step, the tubes containing bucky ball molecules can be closed (annealed shut) by heating under vacuum to about 1100° C. Bucky ball encapsulation can be confirmed by microscopic examination, e.g., by TEM.

Endohedrally loaded tubular carbon molecules can then be separated from empty tubes and any remaining loading materials by taking advantage of the new properties introduced into the loaded tubular molecules, for example, where the metal atom imparts magnetic or paramagnetic properties to the tubes, or the bucky ball imparts extra mass to the tubes. Separation and purification methods based on these properties and others will be readily apparent to those skilled in the art.

Fullerene molecules like $C_{60}$ or $C_{70}$ will remain inside the properly selected tubular molecule (e.g, one based on (10, 10) SWNTs) because from an electronic standpoint (e.g., by van der Waals interaction) the tube provides an environment with a more stable energy configuration than that available outside the tube.

Molecular Arrays of Single-Wall Carbon Nanotubes

An application of particular interest for a homogeneous population of SWNT molecules is production of a substantially two-dimensional array made up of single-walled nanotubes aggregating (e.g., by van der Waals forces) in substantially parallel orientation to form a monolayer extending in directions substantially perpendicular to the orientation of the individual nanotubes. Such monolayer arrays can be formed by conventional techniques employing "self-assembled monolayers" (SAM) or Langmiur-Blodgett films, see Hirch, pp. 75–76. Such a molecular array is illustrated schematically in FIG. 8. In this Figure nanotubes 802 are bound to a substrate 804 having a reactive coating 806 (e.g., gold).

Typically, SAMs are created on a substrate which can be a metal (such as gold, mercury or ITO (indium-tin-oxide)). The molecules of interest, here the SWNT molecules, are linked (usually covalently) to the substrate through a linker moiety such as —S—, —S—$(CH_2)_n$—NH—, —$SiO_3(CH_2)_3$NH— or the like. The linker moiety may be bound first to the substrate layer or first to the SWNT molecule (at an open or closed end) to provide for reactive self-assembly. Langmuir-Blodgett films are formed at the interface between two phases, e.g., a hydrocarbon (e.g., benzene or toluene) and water. Orientation in the film is achieved by employing molecules or linkers that have hydrophilic and lipophilic moieties at opposite ends.

Figure 9:
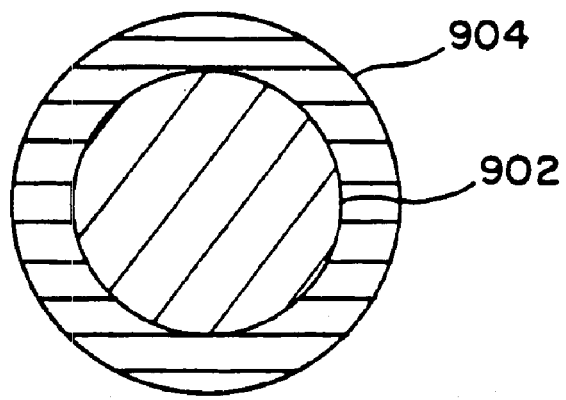
FIG. 9 is a schematic representation of an heterogeneous SWNT molecular array useful in the practice of to the present invention.
Figure 10:
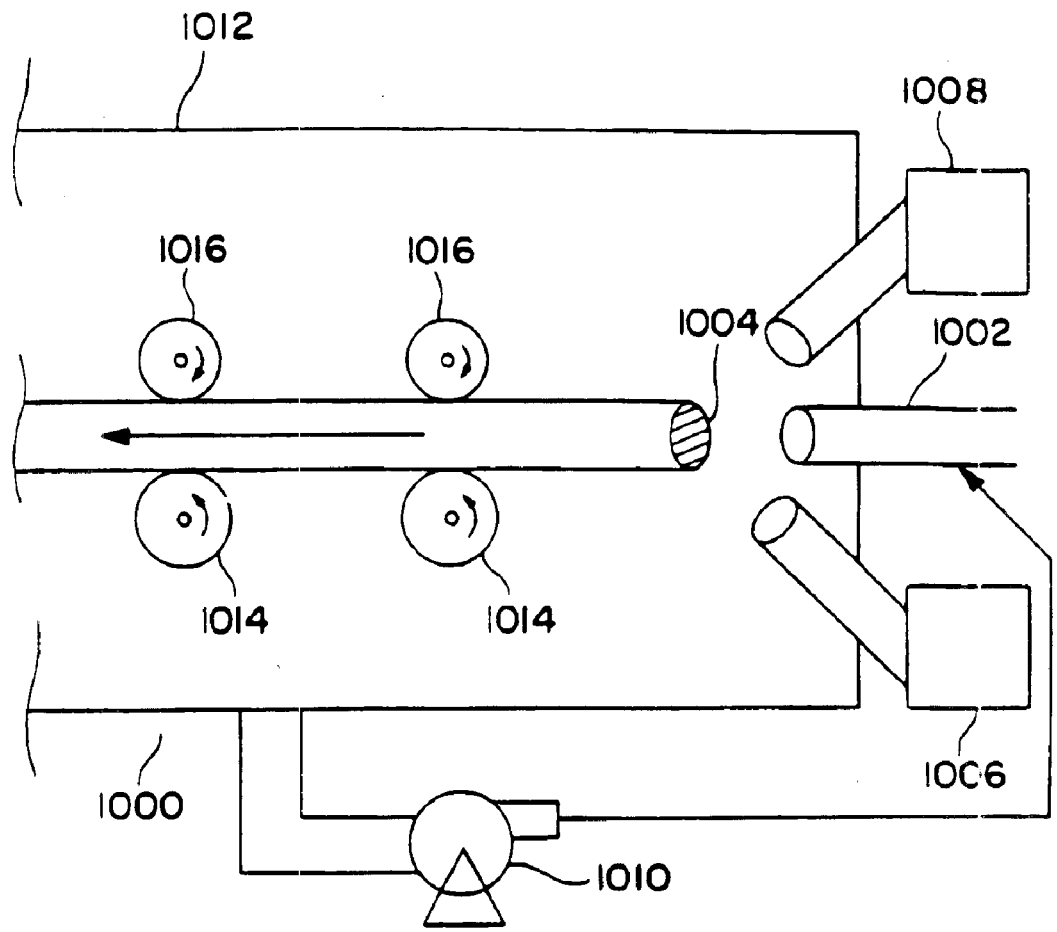
FIG. 10 is a schematic representation of the growth chamber of the fiber apparatus useful in the practice of to the present invention.
Figure 11:
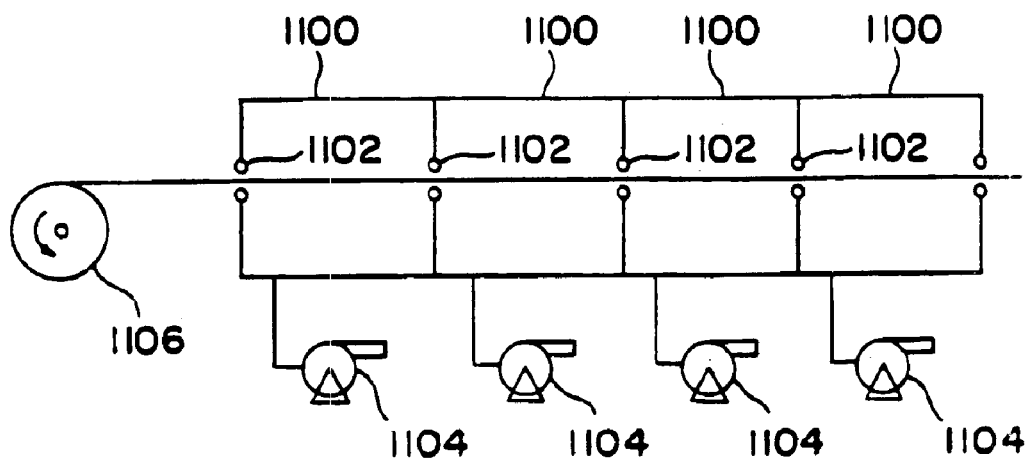
FIG. 11 is a schematic representation of the pressure equalization and collection zone of the fiber apparatus useful in the practice of to the present invention.

The configuration of the SWNT molecular array may be homogenous or heterogeneous depending on the use to which it will be put. Using SWNT molecules of the same type and structure provides a homogeneous array of the type shown in FIG. 8. By using different SWNT molecules, either a random or ordered heterogeneous structure can be produced. An example of an ordered heterogeneous array is shown in FIG. 9 where tubes 902 are (n,n), i.e., metallic in structure and tubes 904 are (m,n), i.e., insulating. This configuration can be achieved by employing successive reactions after removal of previously masked areas of the reactive substrate.

One preferred use of the SWNT molecular arrays of the present invention is to provide a "seed" or template for growth of carbon fiber of single-wall carbon nanotubes as described below. The use of this template is particularly useful for keeping the live (open) end of the nanotubes exposed to feedstock during growth of the fiber. The template array of this invention can be used as formed on the original substrate, cleaved from its original substrate and used with no substrate (the van der Waals forces will hold it together) or transferred to a second substrate more suitable for the conditions of fiber growth.

Where the SWNT molecular array is to be used as a seed or template for growing macroscopic carbon fiber as described below, the array need not be formed as a substantially two-dimensional array. Any form of array that presents at its upper surface a two-dimensional array can be employed. In the preferred embodiment, the template molecular array is a manipulatable length of carbon fiber as produced below.

Another method for forming a suitable template molecular array involves employing purified bucky paper as the starting material. Upon oxidative treatment of the bucky paper surface (e.g., with $O_2/CO_2$ at about 500° C.), the sides as well as ends of SWNTs are attacked and many tube and/or rope ends protrude up from the s of the paper. Disposing the resulting bucky paper in an electric field (e.g., 100 V/cm$^2$ results in the protruding tubes and or ropes aligning in a direction substantially perpendicular to the paper surface. These tubes tend to coalesce due to van der Waals forces to form a molecular array.

Alternatively, a molecular array of SWNTs can be made by "combing" the purified bucky paper starting material. "Combing" involves the use of a sharp microscopic tip such as the silicon pyramid on the cantilever of a scanning force microscope ("SFM") to align the nanotubes. Specifically, combing is the process whereby the tip of an SFM is systematically dipped into, dragged through, and raised up from a section of bucky paper. An entire segment of bucky paper could be combed, for example, by: (i) systematically dipping, dragging, raising and moving forward an SFM tip along a section of the bucky paper, (ii) repeating the sequence in (i) until completion of a row, and (iii) repositioning the tip along another row and repeating (i) and (ii). In a preferred method of combing, the section of bucky paper of interest is combed through as in steps (i)–(ii) above at a certain depth and then the entire process is repeated at another depth. For example, a lithography script can be written and run which could draw twenty lines with 0.5 µm spacing in a 10×10 µm square of bucky paper. The script can be run seven times, changing the depth from zero to three µm in 0.5 µm increments.

Growth of Carbon Fiber from SWNT Molecular Arrays

The present invention provides methods for growing carbon fiber from SWNT molecular arrays to any desired length. The carbon fiber which comprises an aggregation of substantially parallel carbon nanotubes may be produced according to this invention by growth (elongation) of a suitable seed molecular array. The preferred SWNT molecular array is produced as described above from a SAM of SWNT molecules of substantially uniform length. The diameter of the fibers grown according to this method, which are useful in making nanoscale probes and manipulators, can be any value from a few (<10) nanotubes to ropes up to $10^3$ nanotubes.

The first step in the growth process is to open the growth end of the SWNTs in the molecular array. This can be accomplished as described above with an oxidative treatment. Next, a transition metal catalyst is added to the open-ended seed array. The transition metal catalyst can be any transition metal that will cause conversion of the carbon-containing feedstock described below into highly mobile carbon radicals that can rearrange at the growing edge to the favored hexagon structure. Suitable materials include transition metals, and particularly the Group VIII transition metals, i.e., iron (Fe), cobalt (Co), nickel (Nl), ruthenium (Ru), rhodium (Rh), palladium (Pd), osmium (Os), iridium (Ir) and platinum (Pt). Metals from the lanthanide and actinide series and molybdenum can also be used. Preferred are Fe, Ni, Co and mixtures thereof. Most preferred is a 50/50 mixture (by weight) of Ni and Co.

The catalyst should be present on the open SWNT ends as a metal cluster containing from about 10 metal atoms up to about 200 metal atoms (depending on the SWNT molecule diameter). Typically, the reaction proceeds most efficiently if the catalyst metal cluster sits on top of the open tube and does not bridge over more than one or two tubes. Preferred are metal clusters having a cross-section equal to from about 0.5 to about 1.0 times the tube diameter (e.g., about 0.7 to 1.5 nm).

In the preferred process, the catalyst is formed, in situ, on the open tube ends of the molecular array by a vacuum deposition process. Any suitable equipment, such as that used in Molecular Beam Epitaxy (MBE) deposition, can be employed. One such device is a Küdsen Effusion Source Evaporator. It is also possible to effect sufficient deposition of metal by simply heating a wire in the vicinity of the tube ends (e.g., a Ni/CO wire or separate Ni and CO wires) to a temperature below the melting point at which enough atoms evaporate from one wire surface (e.g., from about 900 to about 1300° C.). The deposition is preferably carried out in a vacuum with prior outgassing. Vacuums of about $10^{-6}$ to $10^{-8}$ Torr are suitable. The evaporation temperature should be high enough to evaporate the metal catalyst. Typically, temperatures in the range of 1500 to 2000° C. are suitable for the Ni/Co catalyst of the preferred embodiment. In the evaporation process, the metal is typically deposited as monolayers of metal atoms. From about 1–10 monolayers will generally give the required amount of catalyst. The deposition of transition metal clusters on the open tube tops can also be accomplished by laser vaporization of metal targets in a catalyst deposition zone.

The actual catalyst metal cluster formation at the open tube ends is carried out by heating the tube ends to a temperature high enough to provide sufficient species mobility to permit the metal atoms to find the open ends and assemble into clusters, but not so high as to effect closure of the tube ends. Typically, temperatures of up to about 500° C. are suitable. Temperatures in the range of about 400–500° C. are preferred for the Ni/Co catalysts system of one preferred embodiments.

In a preferred embodiment, the catalyst metal cluster is deposited on the open nanotube end by a docking process that insures optimum location for the subsequent growth reaction. In this process, the metal atoms are supplied as described above, but the conditions are modified to provide reductive conditions, e.g., at 800° C., 10 millitorr of $H_2$ for 1 to 10 minutes. There conditions cause the metal atom clusters to migrate through the system in search of a reactive site. During the reductive heating the catalyst material will ultimately find and settle on the open tube ends and begin to etch back the tube. The reduction period should be long enough for the catalyst particles to find and begin to etch back the nanotubes, but not so long as to substantially etch away the tubes. By changing to the above-described growth conditions, the etch-back process is reversed. At this point, the catalyst particles are optimally located with respect to the tube ends since they already were catalytically active at those sites (albeit in the reverse process).

The catalyst can also be supplied in the form of catalyst precursors which convert to active form under growth conditions such as oxides, other salts or ligand stabilized metal complexes. As an example, transition metal complexes with alkylamines (primary, secondary or tertiary) can be employed. Similar alkylamine complexes of transition metal oxides also can be employed.

In an alternative embodiment, the catalyst may be supplied as preformed nanoparticles (i.e., a few nanometers in diameter) as described in Dai et al., "Single-Wall Nanotubes Produced by Metal-Catalyzed Disproportionation of Carbon Monoxide," Chem. Phys. Lett. 260 (1996), 471–475.

In the next step of the process, the SWNT molecular array with catalyst deposited on the open tube ends is subjected to tube growth (extension) conditions. This may be in the same apparatus in which the catalyst is deposited or a different apparatus. The apparatus for carrying out this process will require, at a minimum, a source of carbon-containing feedstock and a means for maintaining the growing end of the continuous fiber at a growth and annealing temperature where carbon from the vapor can be added to the growing ends of the individual nanotubes under the direction of the transition metal catalyst. Typically, the apparatus will also have means for continuously collecting the carbon fiber. The process will be described for illustration purposes with reference to the apparatus shown in FIGS. 10 and 11.

The carbon supply necessary to grow the SWNT molecular array into a continuous fiber is supplied to the reactor 1000, in gaseous form through inlet 1002. The gas stream should be directed towards the front surface of the growing array 1004. The gaseous carbon-containing feedstock can be any hydrocarbon or mixture of hydrocarbons including alkyls, acyls, aryls, aralkyls and the like, as defined above. Preferred are hydrocarbons having from about 1 to 7 carbon atoms. Particularly preferred are methane, ethane, ethylene, actylene, acetone, propane, propylene and the like. Most preferred is ethylene. Carbon monoxide may also be used and in some reactions is preferred. Use of CO feedstock with preformed Mo-based nano-catalysts is believed to follow a different reaction mechanism than that proposed for in situ-formed catalyst clusters. See Dai.

The feedstock concentration is preferably as chosen to maximize the rate of reaction, with higher concentrations of hydrocarbon giving faster growth rates. In general, the partial pressure of the feedstock material (e.g., ethylene) can be in the 0.001 to 10.0 Torr range, with values in the range of about 1.0 to 10 Torr being preferred. The growth rate is also a function of the temperature of the growing array tip as described below, and as a result growth temperatures and feed stock concentration can be balanced to provide the desired growth rates.

It is not necessary or preferred to preheat the carbon feedstock gas, since unwanted pyrolysis at the reactor walls can be minimized thereby. The only heat supplied for the growth reaction should be focused at the growing tip of the fiber 1004. The rest of the fiber and the reaction apparatus can be kept at room temperature. Heat can be supplied in a localized fashion by any suitable means. For the small fibers useful in making nanoscale probes and manipulators, a laser 1006 focused at the growing end is preferred (eg., a C-W laser such as an argon ion laser beam at 514 nm). For larger fibers, heat can be supplied by microwave energy or R-F energy, again localized at the growing fiber tip. Any other form of concentrated electromagnetic energy that can be focused on the growing tip can be employed (e.g., solar energy). Care should be taken, however, to avoid electromagnetic radiation that will be absorbed to any appreciable extent by the feedstock gas.

The SWNT molecular array tip should be heated to a temperature sufficient to cause growth and efficient annealing of defects in the growing fiber, thus forming a growth and annealing zone at the tip. In general, the upper limit of this temperature is governed by the need to avoid pyrolysis of the feedstock and fouling of the reactor or evaporation of the deposited metal catalyst. For most feedstocks, this is below about 1300° C. The lower end of the acceptable temperature range is typically about 500° C., depending on the feedstock and catalyst efficiency. Preferred are temperatures in the range of about 500° C. to about 1200° C. More preferred are temperatures in the range of from about 700° C. to about 1200° C. Temperatures in the range of about 900° C. to about 1100° C. are the most preferred, since at these temperatures the best annealing of defects occurs. The temperature at the growing end of the cable is preferably monitored by, and controlled in response to, an optical pyrometer 1008, which measures the incandescence produced. While not preferred due to potential fouling problems, it is possible under some circumstances to employ an inert sweep gas such as argon or helium.

In general, pressure in the growth chamber can be in the range of 1 millitorr to about 1 atmosphere. The total pressure should be kept at 1 to 2 times the partial pressure of the carbon feedstock. A vacuum pump 1010 may be provided as shown. It may be desirable to recycle the feedstock mixture to the growth chamber. As the fiber grows it can be withdrawn from the growth chamber 1012 by a suitable transport mechanism such as drive roll 1014 and idler roll 1016. The growth chamber 1012 is in direct communication with a vacuum feed lock zone.

The pressure in the growth chamber can be brought up to atmospheric, if necessary, in the vacuum feed lock by using a series of chambers 1100. Each of these chambers is separated by a loose TEFLON O-ring seal 1102 surrounding the moving fiber. Pumps 1104 effect the differential pressure equalization. A take-up roll 1106 continuously collects the room temperature carbon fiber cable. Product output of this process can be in the range of $10^{-3}$ to $10^1$ feet per minute or more. By this process, it is possible to produce tons per day of continuous carbon fiber made up of SWNT molecules.

Growth of the fiber can be terminated at any stage (either to facilitate manufacture of a fiber of a particular length or when too many defects occur). To restart growth, the end may be cleaned (i.e., reopened) by oxidative etching (chemically or electrochemically). The catalyst particles can then be reformed on the open tube ends, and growth continued.

The molecular array (template) may be removed from the fiber before or after growth by macroscopic physical separation means, for example by cutting the fiber with scissors to the desired length. Any section from the fiber may be used as the template to initiate production of similar fibers.

Figure 12:
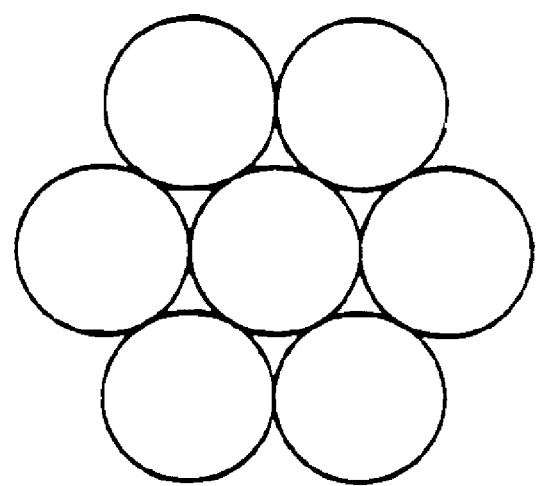
FIG. 12 is a composite array useful in the practice of the present invention.
Figure 13:
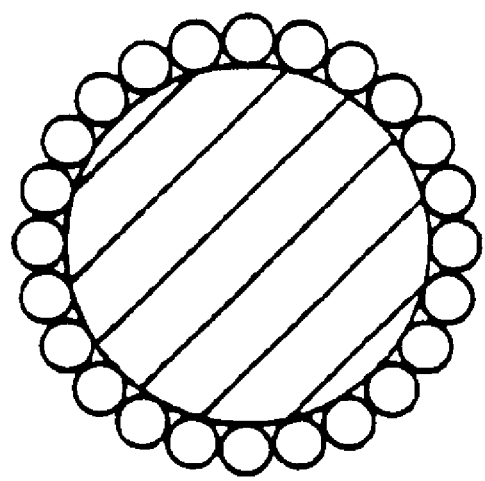
FIG. 13 is a composite array useful in the practice of the present invention.

The continuous carbon fiber of the present invention can also be grown from more than one separately prepared molecular array or template. The multiple arrays can be the same or different with respect to the SWNT type or geometric arrangement in the array. Cable-like structures with enhanced tensile properties can be grown from a number of smaller separate arrays as shown in FIG. 12. In addition to the masking and coating techniques described above, it is possible to prepare a composite structure, for example, by surrounding a central core array of metallic SWNTs with a series of smaller circular non-metallic SWNT arrays arranged in a ring around the core array as shown in FIG. 13.

The carbon nanotube structures useful according to this invention need not be round or even symmetrical in two-dimensional cross section. It is even possible to align multiple molecular array seed templates in a manner as to induce nonparallel growth of SWNTs in some portions of the composite fiber, thus producing a twisted, helical rope, for example. It is also possible to catalytically grow carbon fiber in the presence of an electric field to aid in alignment of the SWNTs in the fibers, as described above in connection with the formation of template arrays.

Random Growth of Carbon Fibers from SWNTs

It is also possible to produce useful compositions comprising a randomly oriented mass of SWNTs, which can include individual tubes, ropes and/or cables. The random growth process has the ability to produce large quantities, i.e., tons per day, of SWNT material.

In general the random growth method comprises providing a plurality of SWNT seed molecules that are supplied with a suitable transition metal catalyst as described above, and subjecting the seed molecules to SWNT growth conditions that result in elongation of the seed molecule by several orders of magnitude, e.g., $10^2$ to $10^{10}$ or more times its original length.

The seed SWNT molecules can be produced as described above, preferably in relatively short lengths, e.g., by cutting a continuous fiber or purified bucky paper. In a preferred embodiment, the seed molecules can be obtained after one initial run from the SWNT felt produced by this random growth process (e.g., by cutting). The lengths do not need to be uniform and generally can range from about 5 nm to 10 µm in length.

These SWNT seed molecules may be formed on nanoscale supports that do not participate in the growth reaction. In another embodiment, SWNTs or SWNT structures can be employed as the support material/seed. For example, the self assembling techniques described below can be used to form a three-dimensional SWNT nanostructure. Nanoscale powders produced by these technique have the advantage that the support material can participate in the random growth process.

The supported or unsupported SWNT seed materials can be combined with a suitable growth catalyst as described above, by opening SWNT molecule ends and depositing a metal atom cluster. Alternatively, the growth catalyst can be provided to the open end or ends of the seed molecules by evaporating a suspension of the seeds in a suitable liquid containing a soluble or suspended catalyst precursor. For example, when the liquid is water, soluble metal salts such as $Fe(NO_3)_3$, $Ni(NO_3)_2$ or $CO(NO_3)_2$ and the like may be employed as catalyst precursors. In order to ensure that the catalyst material is properly positioned on the open end(s) of the SWNT seed molecules, it may be necessary in some circumstances to derivitize the SWNT ends with a moiety that binds the catalyst nanoparticle or more preferably a ligand-stabilized catalyst nanoparticle.

In the first step of the random growth process the suspension of seed particles containing attached catalysts or associated with dissolved catalyst precursors is injected into an evaporation zone where the mixture contacts a sweep gas flow and is heated to a temperature in the range of 250–500° C. to flash evaporate the liquid and provide an entrained reactive nanoparticle (i.e., seed/catalyst). Optionally this entrained particle stream is subjected to a reduction step to further activate the catalyst (e.g., heating from 300–500° C. in $H_2$). A carbonaceous feedstock gas, of the type employed in the continuous growth method described above, is then introduced into the sweep gas/active nanoparticle stream and the mixture is carried by the sweep gas into and through a growth zone.

The reaction conditions for the growth zone are as described above, i.e., 500–1000° C. and a total pressure of about one atmosphere. The partial pressure of the feedstock gas (e.g., ethylene, CO) can be in the range of about 1 to 100 Torr. The reaction is preferably carried out in a tubular reactor through which a sweep gas (e.g., argon) flows.

The growth zone may be maintained at the appropriate growth temperature by 1) preheating the feedstock gas, 2) preheating the sweep gas, 3) externally heating the growth zone, 4) applying localized heating in the growth zone, e.g., by laser or induction coil, or any combination of the foregoing.

Downstream recovery of the product produced by this process can be effected by known means such as filtration, centrifugation and the like. Purification may be accomplished as described above.

The carbon nanotubes prepared by the above described process may also employ the hexaboronitride lattice. This material forms graphene-like sheets with the hexagons made of B and N atoms (e.g., $B_3N_2$ or $C_2BN_3$). It is possible to provide an outer coating to a growing carbon fiber by supplying a BN precursor (e.g., tri-chloroborazine, a mixture of $NH_3$ and $BCl_3$ or diborane) to the fiber which serves as a mandrel for the deposition of BN sheets. This outer BN layer can provide enhanced insulating properties to the metallic carbon fiber of the present invention. Outer layers of pyrolytic carbon polymers or polymer blends may also be employed to impart insulating properties. By changing the feedstock in the above described process from a hydrocarbon to a BN precursor and back again it is possible to grow a fiber made up of individual tubes that alternate between regions of all carbon lattice and regions of BN lattice. In another embodiment, an all BN fiber can be grown by starting with a SWNT template array topped with a suitable catalyst and fed BN precursors. These graphene and BN systems can be mixed because of the very close match of size to the two hexagonal units of structure. In addition, they exhibit enhanced properties due to the close match of coefficients of thermal expansion and tensile properties.

While the invention has been particularly shown and described by the foregoing detailed description, it will be understood by those skilled in the art that various other changes in form and detail may be made without departing from the spirit and scope of the invention.

What is claimed is:

1. A method for untangling single-wall carbon nanotubes comprising:
    a) providing tangled single-wall carbon nanotubes;
    b) cutting at least a portion of the single-wall carbon nanotubes to un-tangle at least some of the single-wall carbon nanotubes; and
    c) recovering a material comprising the single-wall carbon nanotubes un-tangled by the cutting step.

2. The method of claims 1 wherein the single wall carbon nanotubes are cut by a method selected from the group consisting of irradiation with ions, oxidative attack, sonication, oxidative etching, electron beam cutting, plasma arc cutting and combinations thereof.

3. The method of claim 1 wherein the single-wall carbon nanotubes in the material have a mean length that is shorter than a mean length of the single-wall cargon nanotubes in the tangled single-wall carbon nanotubes.

4. The method of claim 1 where in the material comprises single-wall carbon nanotubes having lengths in the range between about 5 and about 1000 nm.

5. The method of claim 1 wherein the material comprises single-wall carbon nanotubes having lengths in the range between about 50 and 500 nm.

6. The method of claim 1 further comprising forming a suspension of the tangled single-wall carbon nanotubes in a liquid medium.

7. The method of claim 6 wherein the liquid medium comprises a hydrocarbon.

8. The method of claim 6 further comprising refluxing the suspension.

9. The method of claim 6 further comprising sonicating the suspension with acoustic energy.

10. The method of claim 1 wherein the tangled single-wall carbon nanotubes comprise single-wall carbon nanotubes in a form selected from the group consisting of ropes and mats.

11. The method of claim 10 further comprising dispersing the tangled single-wall carbon nanotubes in a medium selected from the group consisting of an aqueous detergent solution and organic solvent.

12. The method of claim 11 where in the dispersing is by sonication in a liquid selected from the group consisting of benzene, toluene, xylene, naphthalne, 1,2-dichloroethane and combinations thereof.

13. The method of claim 1 wherein the recover comprises filtration.

14. A method of modifying single-wall nanotubes comprising the step of removing a fullerene cap at least one end of the single-wall carbon nanotubes.

15. The method of claim 14 wherein the single-wall carbon nanotubes are exposed to an oxidative treatment.

16. The mehod of claim 15 wherein the oxidative treatment comprises a technique selected from the group consisting of oxidative etching, electrochemical oxidative etching and combinations thereof.

17. the method of claim 15 wherein the oxidative treatment comprises the use of a chemical selected from the goup consisting of nitric acid, oxygen, carbon dioxide and combinations thereof.

18. The method of claim 15 where in the oxidative treatment is conducted at a temperature at most about 500° C.

19. A method for cutting single-wall carbon nantobues comprising:
   a) providing a material comprising single-wall carbon nanotubes at least some of which have defects in their side walls;
   b) attacking the defects to cut at least a portion of the single wall carbon nanotubes in the material, wherein the single-wall carbon nanotubes in the material are cut by sonication, and wherein the sufficient energy input comprises a frequency of about 40 KHz and a power output of about 20 W; and
   c) recovering a product in which a mean length of single-wall carbon nanotubes in the product is less than a mean length of the single-wall carbon nanotubes in the material.

20. A method for cutting single-wall carbon nanotubes comprising:
   a) providing a material comprising single-wall carbon nanotubes at least some of which have defects in their side walls;
   b) attacking the defects to cut at least a portion of the single wall carbon nanotubes in the material, wherein the single-wall carbon nanotubes in the material are cut by sonication, and wherein the sufficient time is in a range of about 10 minutes and about 24 hours; and
   c) recovering a product in which a mean length of single-wall carbon nanotubes in the product is less than a mean length of the single-wall carbon nanotubes in the material.

21. A method for cutting single-wall carbon nanotubes comprising:
   a) providing a material comprising single-wall carbon nanotubes at least some of which have defects in their side walls;
   b) attacking the defects to cut at least a portion of the single wall carbon nanotubes in the material, wherein the attacking of such defects of the single-wall carbon nanotubes is done by a method selected from the group consisting of sonication of a suspension of single-wall carbon nanotubes at a sufficient energy input and for a sufficient time, oxidation, oxidative etching, free radical attack, chemical reactions, heat pressure, annealing, refluxing and combinations thereof, wherein the single-wall carbon nanotubes in the suspension are cut by sonication of the suspension, and wherein the sufficient energy input comprises a frequency of about 40 KHz and a power output of about 20 W; and
   c) recovering a product in which a mean length of single-wall carabon nanotubes in the product is less than a mean length of the single-wall carbon nanotubes in the material.

22. A method for cutting single-wall carbon nanotubes comprising:
   a) providing a material comprising single-wall carbon nanotubes at least some of which have defects in their side walls;
   b) attacking the defects to cut at least a protion of the single wall cargon nanotubes in the material, wherein the attacking of such defects of the single-wall carbon nanotubes is done by a method selected from the group consisting of sonication of a suspension of single-wall carbon nanotubes at a sufficient energy input and for a sufficient time, oxidation, oxidative etching, free radical attack, chemical reaction, heat, pressure, annealing, refluxing and combinations thereof, wherein the single-wall carbon nanotubes in the suspension are cut by sonication of the suspension, and wherein the sufficient time is in a range of about 10 minutes and about 24 hours; and
   c) recovering a product in which a mean length of single-wall carbon nanotubes in the product is less than a mean length of the single-wall carbon nanotubes in the material.

* * * * *